(12) United States Patent
Pu et al.

(10) Patent No.: US 9,029,898 B2
(45) Date of Patent: May 12, 2015

(54) LIGHT EMITTING DIODE AND ILLUMINATION DEVICE USING SAME

(71) Applicant: Formosa Epitaxy Incorporation, Taoyuan County (TW)

(72) Inventors: Chi-Chih Pu, Taoyuan County (TW); Chen-Hong Lee, Taoyuan County (TW); Tzu-Hsiang Wang, Taoyuan County (TW); Sheng-Hung Hsu, Taoyuan County (TW); Wei-Kang Cheng, Taoyuan County (TW); Shyi-Ming Pan, Taoyuan County (TW)

(73) Assignee: Formosa Epitaxy Incorporation, Taoyuan County (TW)

( * ) Notice: Subject to any disclaimer, the term of this patent is extended or adjusted under 35 U.S.C. 154(b) by 0 days.

(21) Appl. No.: 14/174,010

(22) Filed: Feb. 6, 2014

(65) Prior Publication Data
US 2014/0153239 A1 Jun. 5, 2014

Related U.S. Application Data

(63) Continuation-in-part of application No. 12/547,571, filed on Aug. 26, 2009, now Pat. No. 8,698,175.

(60) Provisional application No. 61/871,843, filed on Aug. 29, 2013.

(51) Int. Cl.
*H01L 33/50* (2010.01)
*H01L 33/38* (2010.01)
*H01L 25/075* (2006.01)

(52) U.S. Cl.
CPC .............. *H01L 33/508* (2013.01); *H01L 33/38* (2013.01); *H01L 25/0753* (2013.01); *H01L 33/505* (2013.01); *H01L 33/507* (2013.01); *H01L 2933/0041* (2013.01); *H01L 2224/48091* (2013.01); *H01L 2224/48137* (2013.01); *H01L 2224/73265* (2013.01); *H01L 2924/19107* (2013.01)

(58) Field of Classification Search
CPC ......... H01L 33/20; H01L 33/44; H01L 33/54; H01L 33/60; H01L 33/62; H01L 27/153; H01L 25/0753
USPC .............. 257/98, 88, E33.061; 362/237, 260; 438/29
See application file for complete search history.

(56) References Cited

U.S. PATENT DOCUMENTS 8,698,175 B2 * 4/2014 Cheng et al. .................... 257/98

* cited by examiner

*Primary Examiner* — Monica D Harrison
(74) *Attorney, Agent, or Firm* — Rosenberg, Klein & Lee

(57) ABSTRACT

The present invention relates to a light emitting diode (LED). The LED comprises an LED die, one or more metal pads, and a fluorescent layer. The characteristics of the present invention include that the metals pads are left exposed for the convenience of subsequent wiring and packaging processes. In addition, the LED provided by the present invention is a single light-mixing chip, which can be packaged directly without the need of coating fluorescent powders on the packaging glue. Because the fluorescent layer and the packaging glue are not processed simultaneously and are of different materials, the stress problem in the packaged LED can be reduced effectively.

34 Claims, 34 Drawing Sheets

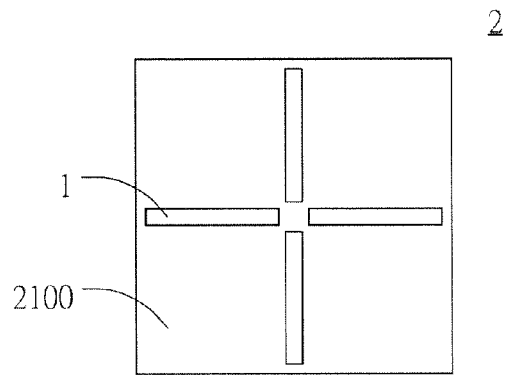
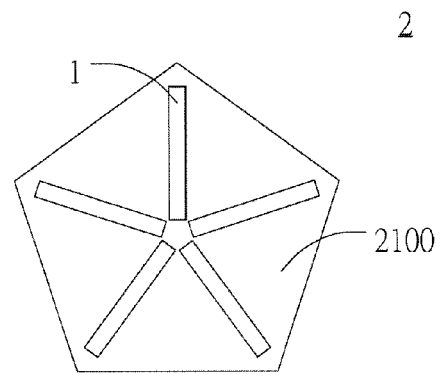
FIG. 26     FIG. 27
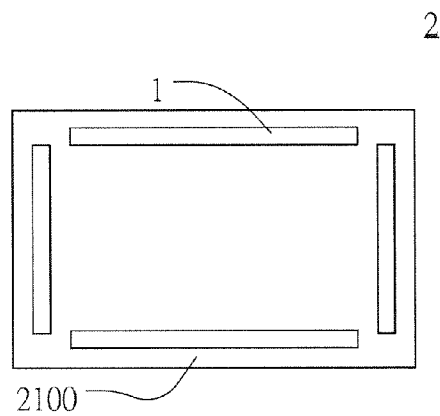
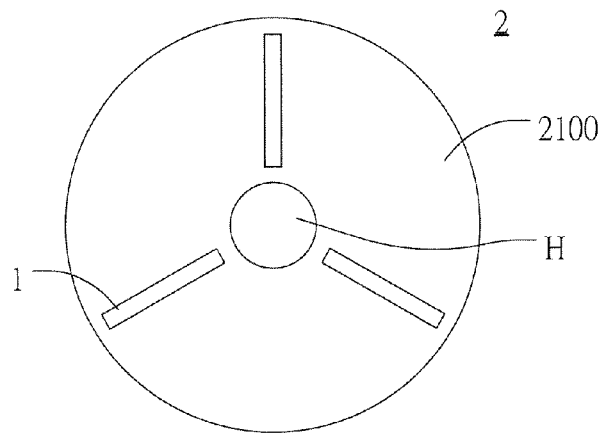
FIG. 28     FIG. 29

LIGHT EMITTING DIODE AND ILLUMINATION DEVICE USING SAME

CROSS REFERENCE TO RELATED APPLICATIONS

This is a Continuation in Part application of Ser. No. 12/547,571, now pending, filed on Aug. 26, 2009.

FIELD OF THE INVENTION

The present invention relates to a light emitting diode, and particularly to a light emitting diode capable of mixing light.

BACKGROUND OF THE INVENTION

A light emitting diode (LED) is a light emitting device manufactured by semiconductor materials with two electrodes. The light emitting principle of the LED is that by applying a voltage between the electrodes and supplying an extremely small current, excess energy can be released in the form of light via the recombination process of electrons and holes. The LED is different from an incandescent bulb in that the former is luminescent with advantages of low power consumption, elongated lifetime, no warm-up time, and fast response. In addition, because the LED is small, vibration tolerable, and suitable for mass production, it is easy to be manufactured in an extremely tiny or a matrix form in accordance with application requirements. Currently, the LED is widely applied to indicator and display apparatuses of information, communication, and consumer electronic products, and has become a dispensable and important device in daily lives.

Presently, most LEDs are coated with fluorescent powders in the packages during the packaging process. Thereby, the stress problem will occur in the packages. The present invention provides an LED in a single light-mixing chip, which can be packaged directly, and hence reducing effectively the stress problem as described above.

SUMMARY

An objective of the present invention is to provide a light emitting diode (LED), which can expose metal pads for the convenience of subsequent wiring and packaging processes.

Another objective of the present invention is to provide an LED, which can provide a single light-mixing chip for direct packaging and reducing the stress problem in the packaged LED.

In order to achieve the objectives described above, the present invention provides an LED, which comprises an LED die, one or more metal pads, and a fluorescent layer. The LED die includes two electrodes. The metal pads are set on the electrodes of the LED die. The fluorescent layer is set on the LED die. Beside, the fluorescent layer does not cover the metal pads completely. Instead, the metal pads are exposed for the convenience of subsequent wiring and packaging processes. The fluorescent layer converts directly partial or all of light with a first wavelength produced by the LED die to light with at least a second wavelength.

BRIEF DESCRIPTION OF THE DRAWINGS

FIGS. 26-29 are schematic diagrams according to a nineteenth preferred embodiment of the present invention.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
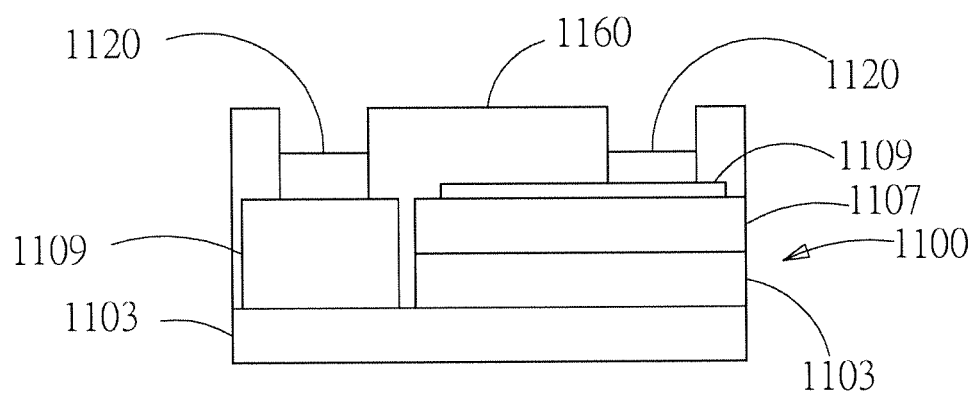
FIG. 1 shows a structural schematic diagram according to a first preferred embodiment of the present invention.

FIG. 1 shows a structural schematic diagram according to a first preferred embodiment of the present invention. As shown in the figure, the present embodiment provides a light emitting diode (LED) 1, which comprises an LED die 1100, one or more metal pads 1120, and a fluorescent layer 1160. The LED die 1100 includes two electrodes 1109. The number of the metal pads 1120 according to the present embodiment is two. The two metal pads 1120 are set on the two electrodes 1109, respectively. The fluorescent layer 1160 is set on the LED die 1100. In addition, the fluorescent layer 1160 does not cover the two metal pads 1120 completely. Instead, the metal pads 1120 are exposed for the convenience of subsequent wiring and packaging processes. The fluorescent layer 1160 converts partial or all of light with a first wavelength produced by the LED die 1100 to light with at least a second wavelength for producing light mixing. The LED 1 provided according to the present embodiment is a light-mixing chip, which can be packaged directly without the need of coating fluorescent powders on the package. The thickness of the fluorescent layer 1160 is greater than 30 um. The materials of the fluorescent layer 1160 include fluorescent powders and an organic polymer material. The fluorescent powders are chosen from the group comprising red fluorescent powders, green fluorescent powders, blue fluorescent powders, and the combination of the fluorescent powders described above.

The LED die 1100 described above further comprises a first semiconductor layer 1103, a light emitting layer 1105, and a second semiconductor layer 1107. The light emitting layer 1105 is set on the first semiconductor layer 1103; the second semiconductor layer 1107 is set on the light emitting layer 1105; the metal pads 1120 are set on the electrodes 1109. When the first semiconductor layer 1103 is P-type, the second semiconductor layer 1107 is N-type. Alternatively, when the first semiconductor layer 1103 is N-type, the second semiconductor layer 1107 is P-type.

Figure 2:
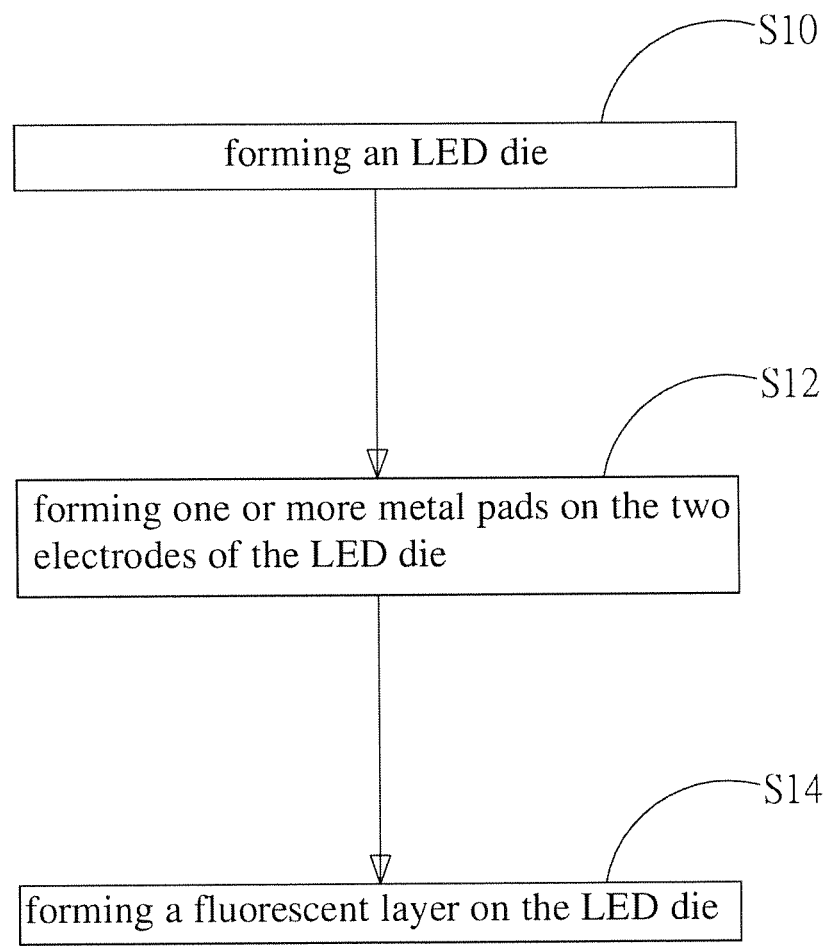
FIG. 2 shows a flowchart according to the first preferred embodiment of the present invention.
Figure 3:
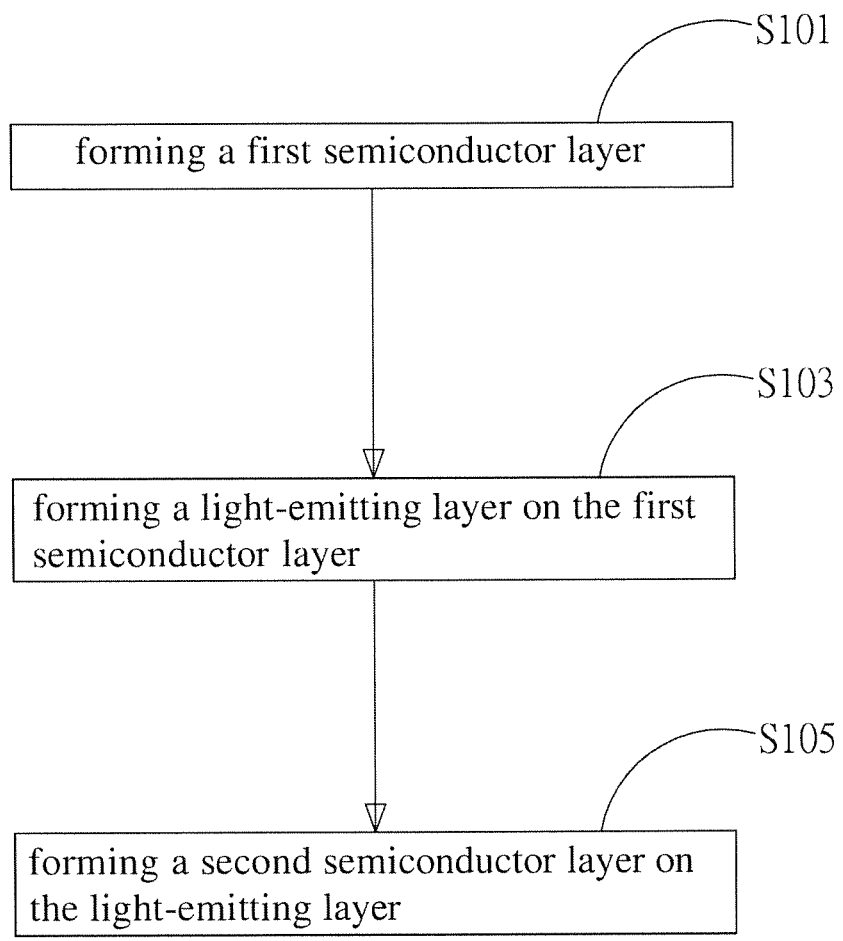
FIG. 3 shows a flowchart for forming an LED die according to the first preferred embodiment of the present invention.

FIG. 2 shows a flowchart according to the first preferred embodiment of the present invention. As shown in the figure, in contrast to FIG. 1, which shows an LED 1, the present figure shows a method for manufacturing the LED 1. To manufacture the LED 1, the step S10 is first executed for forming an LED die 1100, which includes two electrodes 1109. Referring together to FIG. 3, the method for forming the LED die 1100 comprises the step S101 forming a first semiconductor layer 1103; the step S103 forming a light emitting layer 1105 on the first semiconductor layer 1103; and finally the step S105 forming a second semiconductor layer 1107 on the light emitting layer 1105.

After the step S10 is completed, the step S12 is executed for forming one or more metal pads 1120 on the two electrodes 1109 of the LED die 1100. Next, the step S14 is executed for forming a fluorescent layer 1160 on the LED die 1100. The fluorescent layer 1160 does not cover the metal pads 1120 completely. Instead, the metal pads 1120 are left exposed for the convenience of subsequent wiring and packaging processes.

For forming the fluorescent layer 1160 on the LED die 1100, glue dispensing, spaying, or pouring methods are applied. For avoiding the fluorescent layer 1160 from covering the metal pads 1120 completely during the forming process of the fluorescent layer 1160, prior to forming the fluorescent layer 1160 on the LED die 1100 using the glue dispensing, spaying, or pouring methods, a mask is used on the metal pads 1120. The mask can mask the metal pads 1120 and expose the location to form the fluorescent layer 1160. Besides, the mask is manufactured by lithography or by screen-printing using organic polymer materials such as photoresist. The glue ratio in the glue dispensing, spaying, or pouring methods is controlled according to the photoelectric properties of the LED die 1100.

Figure 4A:
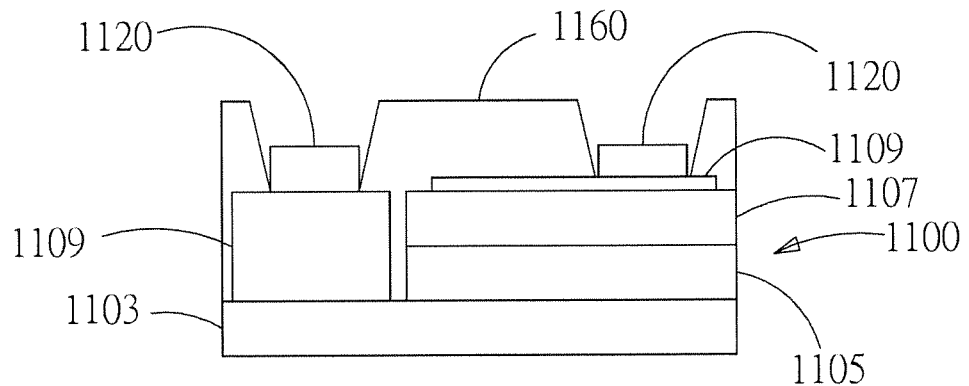
FIG. 4A shows a structural schematic diagram according to a second preferred embodiment of the present invention.
Figure 4B:
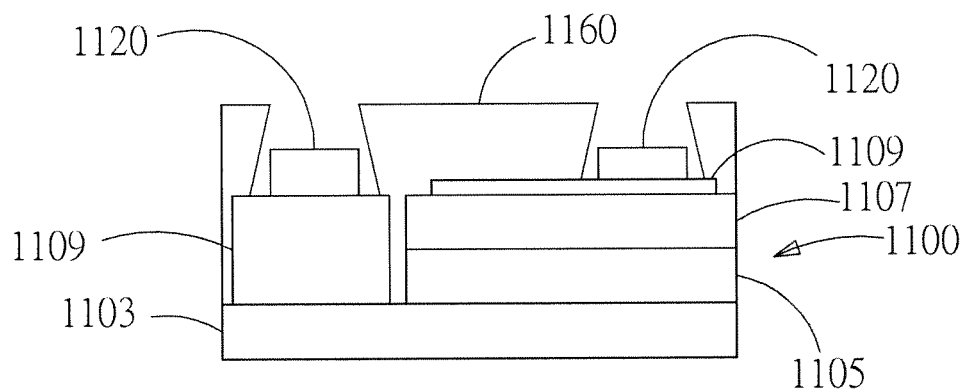
FIG. 4B shows a structural schematic diagram according to a third preferred embodiment of the present invention.

FIGS. 4A and 4B show structural schematic diagrams according to a second and a third preferred embodiments of the present invention. As shown in the figures, according to the present embodiments, two LED structures are provided. The difference between the present embodiments and the one described above is that, according to the present embodiments, the shape of the fluorescent layer 1160 can be changed by etching. The shapes of the fluorescent layer 1160 can be trapezoidal or upside-down trapezoidal.

Figure 5:
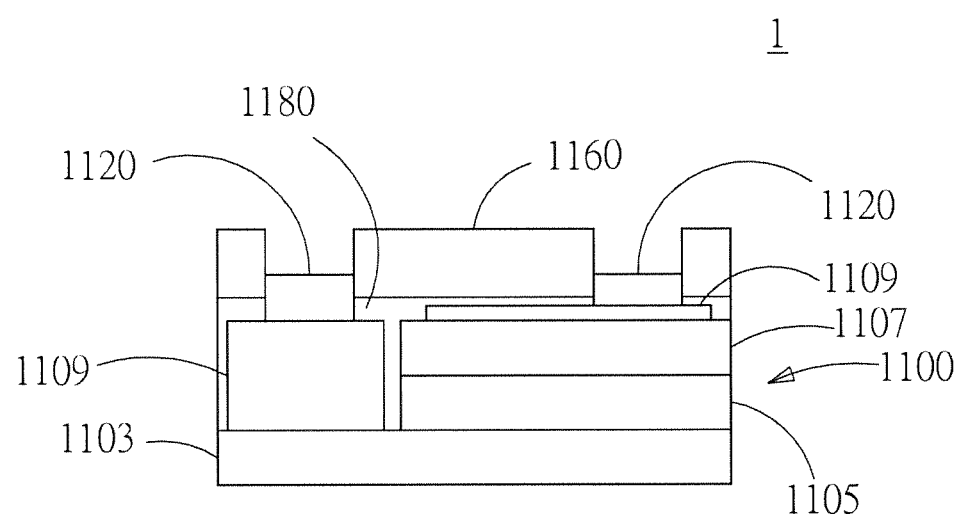
FIG. 5 shows a structural schematic diagram according to a fourth preferred embodiment of the present invention.

FIG. 5 shows a structural schematic diagram according to a fourth preferred embodiment of the present invention. As shown in the figure, the present embodiment provides an LED 1 comprising an LED die 1100, one or more metal pads 1120, a dielectric layer 1180, and a fluorescent layer 1160. The LED die 1100 includes two electrodes 1109. The metal pads are set on the electrodes 1109 of the LED die 1100. The dielectric layer 1180 is set on the LED die 1100, and is located on the periphery of the metal pads 1120. The fluorescent layer 1160 is set on the dielectric layer 1180, and is located on the periphery of the metal pads 1120. The fluorescent layer 1160 converts partial or all of light with a first wavelength produced by the LED die 1100 to light with at least a second wavelength for producing light mixing. In addition, the fluorescent layer 1160 does not cover the metal pads 1120 completely. Instead, the metal pads 1120 are exposed for the convenience of subsequent wiring and packaging processes. The LED 1 provided according to the present embodiment is a light-mixing chip, which can be packaged directly without the need of coating fluorescent powders on the package. Besides, the thickness of the fluorescent layer 1160 is greater than 30 um. The LED die 1100 further includes a first semiconductor layer 1103, a light emitting layer 1105, and a second semiconductor layer 1107.

Figure 6:
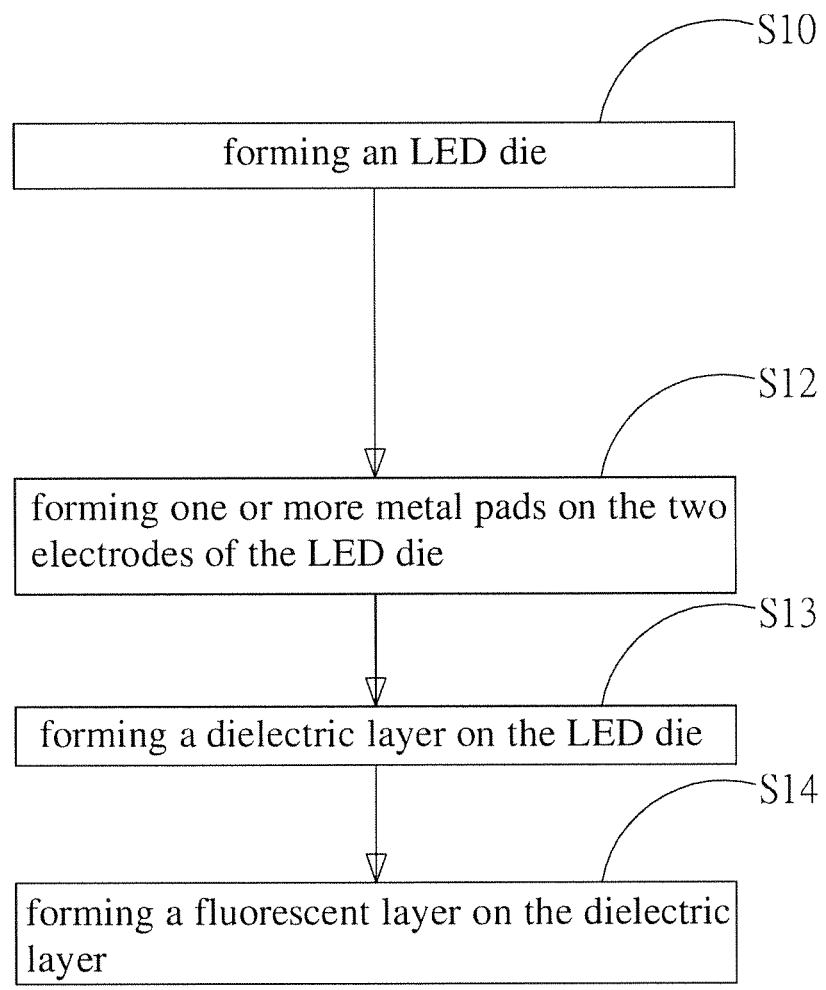
FIG. 6 shows a flowchart according to the fourth preferred embodiment of the present invention.

FIG. 6 shows a flowchart according to the fourth preferred embodiment of the present invention. As shown in the figure, in contrast to FIG. 5, which shows an LED 1, the present figure shows a method for manufacturing the LED 1. To manufacture the LED 1, the step S10 is first executed for forming an LED die 1100. Then the step S12 is executed for forming one or more metal pads 1120 on the electrodes 1109 of the LED die 1100. Next, the step S13 is executed for forming a dielectric layer 1180 on the LED die 1100. Finally, the step S14 is executed for forming a fluorescent layer 1160 on the dielectric layer 1180. The fluorescent layer 1160 does not cover the metal pads 1120 completely. Instead, the metal pads 1120 are left exposed for the convenience of subsequent wiring and packaging processes.

For forming the fluorescent layer 1160 on the LED die 1100, glue dispensing, spaying, or pouring methods are applied. For avoiding the fluorescent layer 1160 from covering the metal pads 1120 completely during the forming process of the fluorescent layer 1160, prior to forming the fluorescent layer 1160 on the LED die 1100 using the glue dispensing, spaying, or pouring methods, a mask is used on the metal pads 1120. The mask can mask the metal pads 1120 and expose the location to form the fluorescent layer 1160. Besides, the mask is manufactured by lithography or by screen-printing using organic polymer materials such as photoresist.

Figure 7:
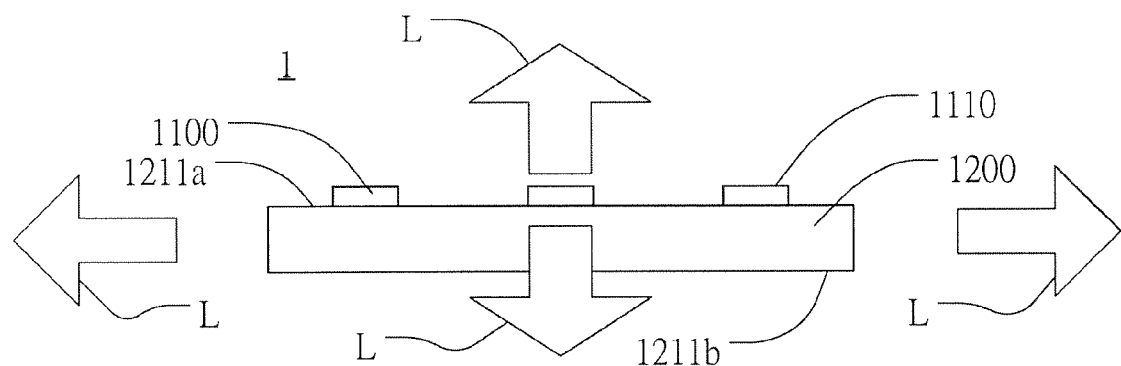
FIG. 7 and FIG. 8 are structural schematic diagrams according to a fifth preferred embodiment of the present invention.
Figure 8:
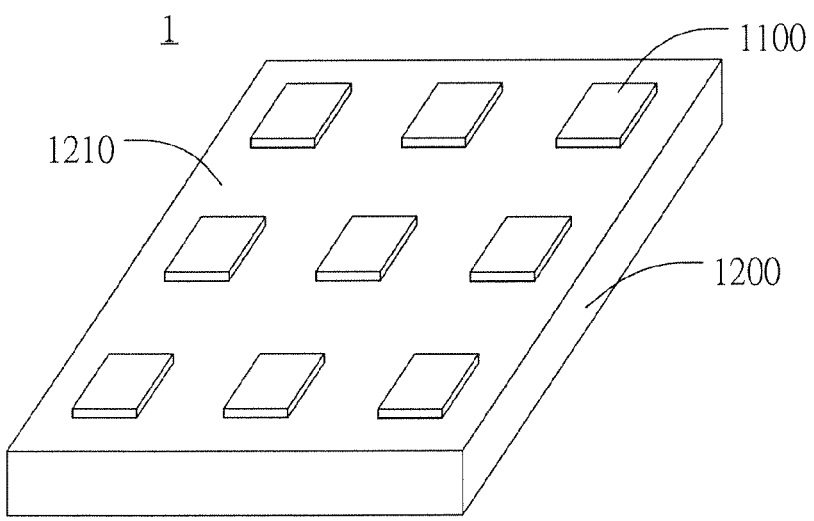

As shown in FIG. 7 and FIG. 8, a light emitting diode 1 according to a fifth preferred embodiment of the present invention may comprise a plurality of LED dies 1100, wherein each of the LED die 1100 comprises a transparent substrate 1200 and a light emitting structure comprising a first semiconductor layer 1103, a light emitting layer 1105, and a second semiconductor layer 1107 as described above, and wherein the transparent substrate 1200 of the LED dies 1100 is identical, which means the light emitting structures of the LED dies 1100 may be arranged as a matrix in sequential or interlaced on the same transparent substrate 1200. The transparent substrate 1200, which is a sheet type substrate, comprises a support surface 1210 and a second main surface 1211b corresponding to the support surface 1210. At least one of the LED dies 1100 may emit light in multi directions, and comprise a first light emitting surface 1110 on the second semiconductor layer 1107, wherein at least part of the light emitted from the light emitting structure of the LED die 1100 may insert into and then emerge from the transparent substrate 1200. A first main surface 1211a of the light emitting diode 1, where the light may emerge from, comprises the first light emitting surface 1110 of the LED die 1100 and at least a part of the support surface 1210 uncovered by the light emitting structure of the LED die 1100. The disposition described above may also be reversed, or the light emitting structures of the LED dies 1100 may be disposed respectively on the both surfaces, the support surface 1210 and the second main surface 1211b, of the transparent substrate 1200. Further, at least a part of the light emitting structures of LED dies 1100 may be disposed on the support surface 1210 corresponding to the light emitting structures of the other LED dies 1100 disposed on the second main surface 1211b interlacedly, which means the light emitted from the light emitting structure of the LED die 1100 deposited on one surface of the transparent substrate 1200 would not be blocked by another light emitting structure of LED die 1100 deposited on the corresponding surface of the transparent substrate 1200. Therefore the luminance of the light emitting diode 1 may be further increased according to the present invention.

The transparent substrate 1200 may comprise sapphire or at least one material selected from aluminum oxide (Al2O3), silicon carbide (SiC), glass, plastic or rubber according to the embodiments of the present invention. However, the conventional sapphire substrate used for growing a conventional light emitting diode is fragile when applied in the present invention. According to experiment results of the present invention, the transparent substrate 1200 is preferably a sapphire substrate having a thickness thicker than or equal to 200 um, and the light emitting structure of the LED die 1100 may grow from the support surface 1210 of the transparent substrate 1200 to prevent the die bond process, simplify the manufacturing steps for the light emitting diode 1, overcome the drawback described above and perform better reliability, supporting performance and transparency according to the embodiment of the present invention. In addition, under the thickness condition of the transparent substrate 1200 according to the present invention, a light transmittance of the transparent substrate 1200 is larger than or equal to 70% for light beams having a wavelength range larger than or equal to 420 nanometers, or light beams having a wavelength rage smaller than or equal to 470 nanometers.

Further, for effectively emitting light in multi directions, including dual directions or full directions, from the light emitting diode 1, the LED die 1100 according to the present invention preferably has a beam angle greater than 180 degrees. Accordingly, the light emitting structure of the LED die 1100 disposed on the transparent substrate 1200 may emit light beams from the first light emitting surface 1110 toward a direction away from the transparent substrate 1200, and may also emit light beams at least partially entering the transparent substrate 1200. The light beams entering the transparent substrate 1200 may emerge from the second main surface 1211b opposite to the support surface 1210, and the light beams entering the transparent substrate 1200 may also be emerged from at least a part of the support surface 1210 uncovered by the light emitting structures of the LED dies 1100 or emerged from other surfaces of the transparent substrate 1200. Furthermore, according to the present invention, an area of the first main surface 1211a or an area of the second main surface 1211b is larger than or equal to 5 times of a total area formed from at least one of the first light emitting surfaces 1110 of the LED dies 1100, and this is a preferred proportion according to the consideration of both the luminous efficiency and the heat dissipation performance.

Figure 9A:
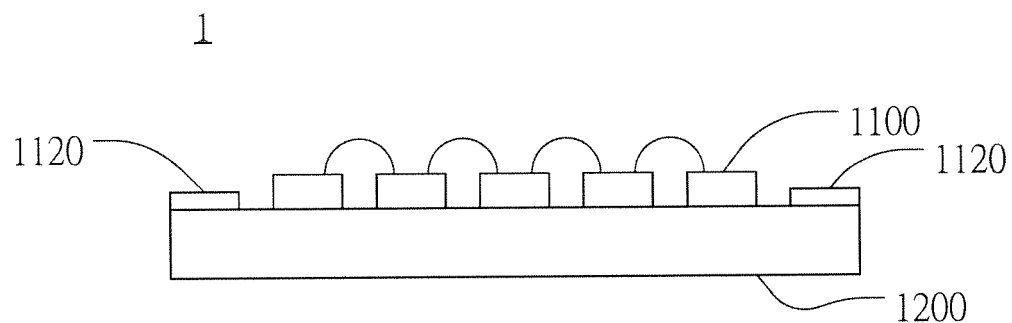
FIGS. 9A-9E are structural schematic diagrams in different manufacturing steps according to the fifth preferred embodiment of the present invention.
Figure 9B:
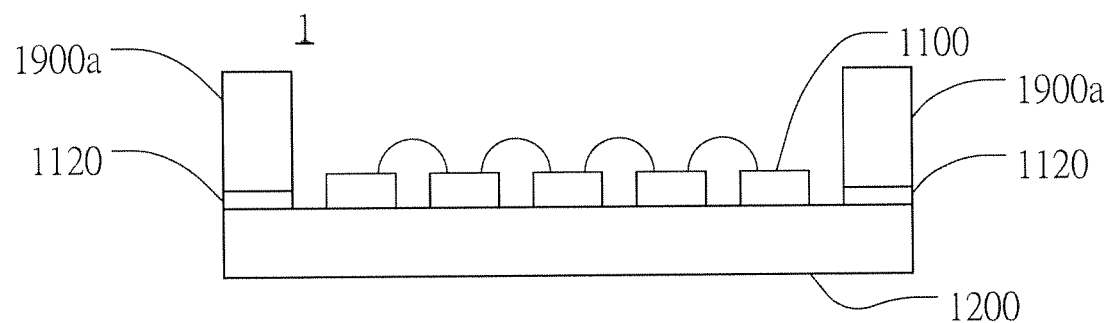
Figure 9C:
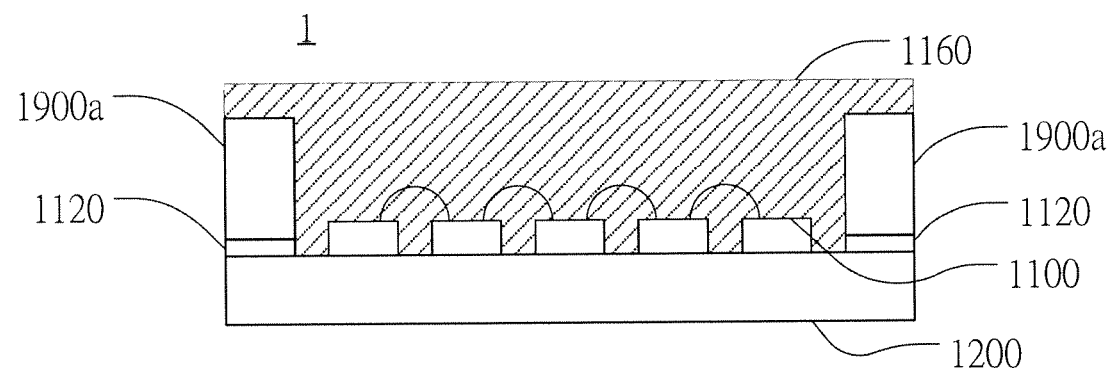
Figure 9D:
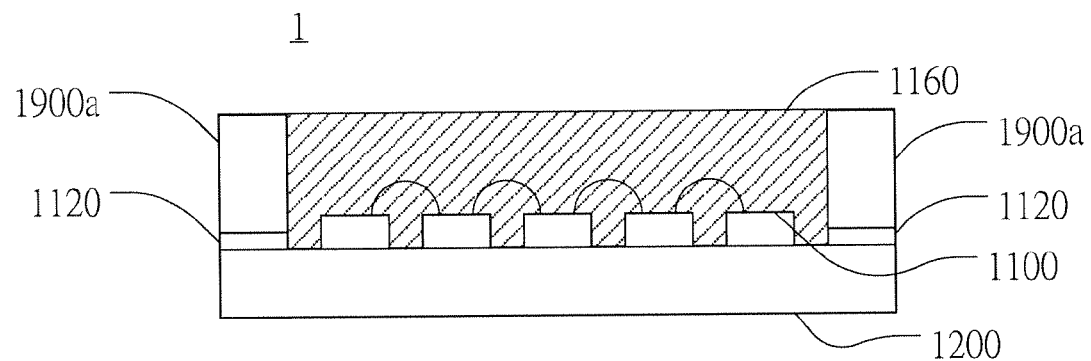
Figure 9E:
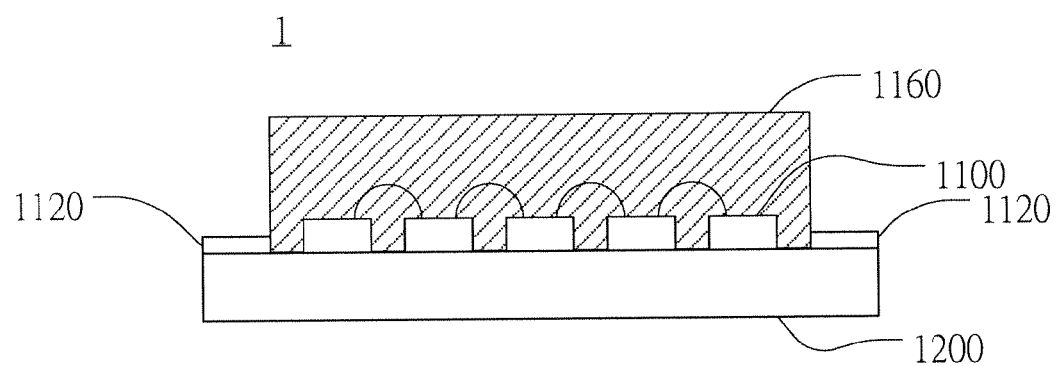

As shown in FIGS. 9A-9E, the structure of the light emitting diode 1 in different manufacturing steps according to the fifth preferred embodiment of the present invention is disclosed, wherein the light emitting diode 1 further comprises a fluorescent layer 1160 and at least two metal pads 1120 disposed on the LED dies 1100, and wherein the fluorescent layer 1160 has a thickness greater than 30 um and exposes the metal pads 1120. As shown in FIG. 9A, a first step is providing a plurality of the LED dies 1100 and at least two metal pads 1120 disposed on the transparent substrate 1200; wherein the LED die 1100 may be connected to the adjacent LED dies 1100 electrically in series or parallel through bonding wire or electric pattern on the transparent substrate 1200; and wherein the metal pads 1120 may be connected to the LED dies 1100 electrically through bonding wire or electric pattern on the transparent substrate 1200. As shown in FIG. 9B, a second step is providing a mask or first tape layers 1900a on the metal pads 1120, wherein the first tape layer 1900a may cover the top surface of the metal pad entirely and has a thickness greater than 30 um and comprises a sticky material selected from polymer, for example PE, PS, PET, PP, PTFE, PMMA, PC, PVC, or fiber, metal, compound material and etc. In this step, the first tape layers 1900a may be attached to the metal pads 1120 directly without lithography process. Preferably, the thickness of the first tape layer 1900a may be greater than or equal to 120 um according to the fifth preferred embodiment of present invention, and the up limitation of the working temperature of the first tape layer 1900a may be higher than or equal to 120° C. As shown in FIG. 9C, a third step is providing a fluorescent layer 1160 on the LED dies 1100, wherein the fluorescent layer 1160 may cover the first main surface 1211a and fill up the space between the first tape layers 1900a. As shown in FIG. 9D, because the fluorescent layer 1160 may overflow and cover the first tape layers 1900a, a fourth step is removing the redundant part of the fluorescent layer 1160 to expose the first tape layer 1900a, and shaping the surface of the remaining part of the fluorescent layer 1160. So that the light emitting diode 1 may be shaped like a card, a stick, a popsicle, a cube, a ball, a candle or etc. As shown in FIG. 9E, a fifth step is tearing the first tape layer 1900a to expose the metal pad 1120, so that a driving power may drive the light emitting diode 1 through the metal pads 1120 according to the present invention.

Figure 10A:
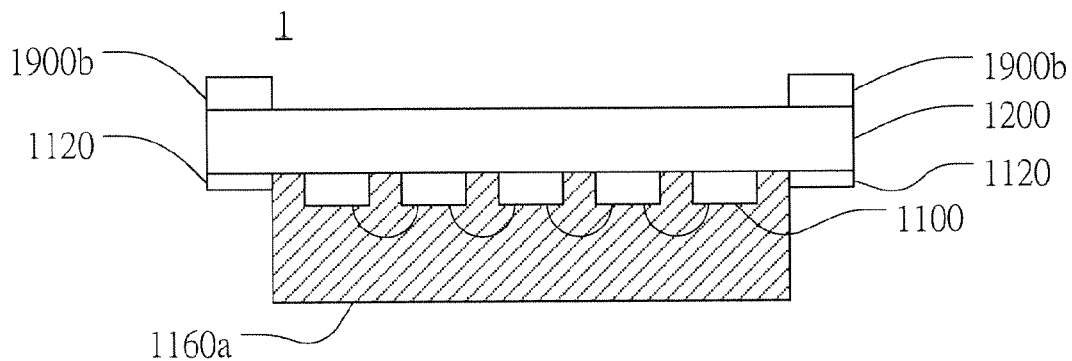
FIGS. 10A-10D are structural schematic diagrams in different manufacturing steps according to a sixth preferred embodiment of the present invention.
Figure 10B:
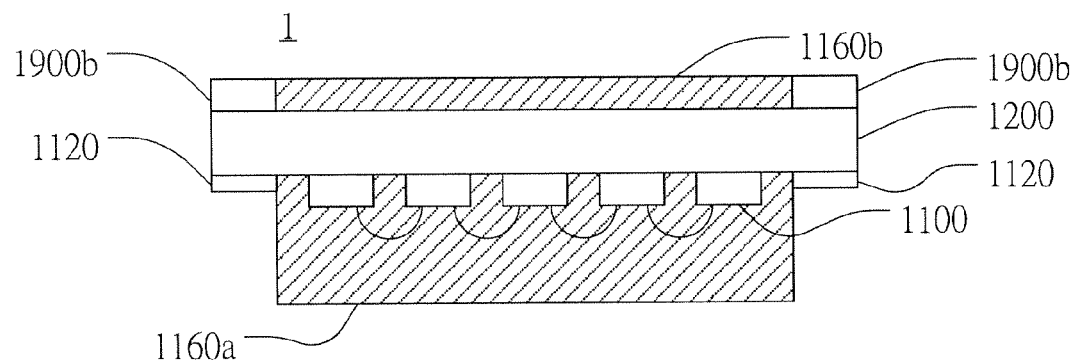
Figure 10C:
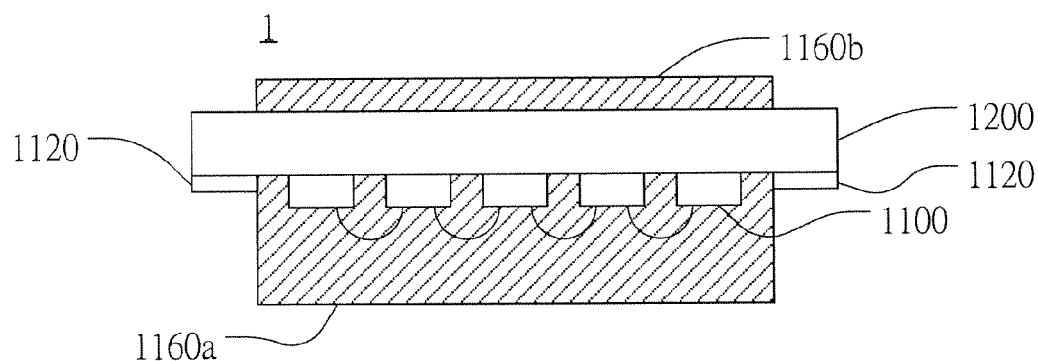
Figure 10D:
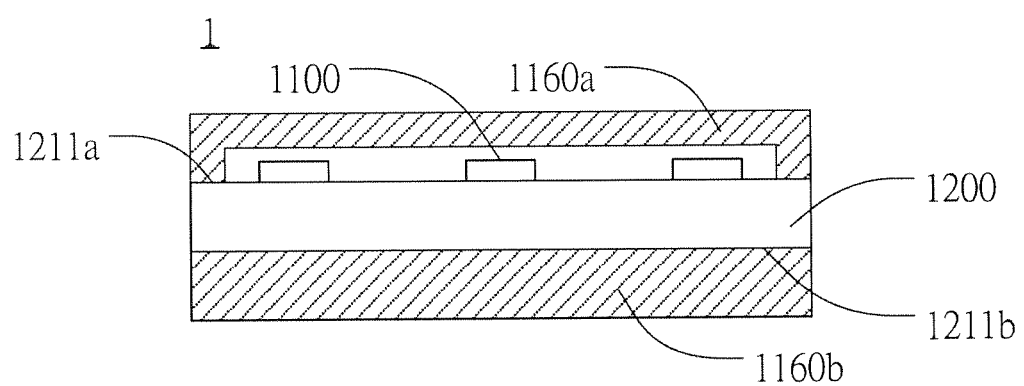

As shown in FIGS. 10A-10D, a structure of a light emitting diode 1 in different manufacturing steps according to a sixth preferred embodiment of the present invention is disclosed, wherein the light emitting diode 1 according to this embodiment comprises a first fluorescent layer 1160a, a second fluorescent layer 1160b and at least two metal pads 1120 disposed on a plurality of LED dies 1100, and wherein the first fluorescent layer 1160a has a thickness greater than 30 um and exposes the metal pads 1120. In contrast to the fifth preferred embodiment as shown in FIGS. 9A-9E, the light emitting diode 1 according to this embodiment further comprises the second fluorescent layer 1160b disposed corresponding to the first fluorescent layer 1160a, wherein the second fluorescent layer 1160b covers at least a part of the second main surface 1211b of the transparent substrate 1200. As shown in FIG. 10A, after disposing the fluorescent 1160a on the LED dies 1100 and exposing the metal pads 1120, which may use the same manufacturing steps as described in the above embodiments, a first step of this embodiment is providing a mask or a second tape layers 1900b on the second main surface 1211b, wherein the second tape layer 1900b may have a thickness greater than 30 um and comprise a sticky material selected from polymer, for example PE, PS, PET, PP, PTFE, PMMA, PC, PVC, or fiber, metal, compound material and etc. In this step, the second tape layers 1900b may be attached to the second main surface 1211b directly without lithography process. Preferably, the thickness of the second tape layer 1900b may be greater than or equal to 120 um according to the sixth preferred embodiment of present invention, and the up limitation of the working temperature of the second tape layer 1900b may be higher than or equal to 120° C. As shown in FIG. 10B, a second step is providing a fluorescent layer 1160b on the second main surface 1211b between the second tape layers 1900b. As shown in FIG. 10C, after shaping the second fluorescent layer 1160b, a third step is tearing the second tape layers 1900b to expose the metal pads 1120, so that the light emitting diode 1 may be shaped like a card, a stick, a popsicle, a cube, a ball, a candle or etc. according to the present invention. FIG. 10D shows one kind of improvement that the light emitting diode 1 may comprise a space between the first fluorescent layer 1160a and LED dies 1100, which means the first fluorescent layer 1160a may not directly contact the LED dies 1100.

According to the fifth and sixth embodiments of the present invention, the fluorescent layer 1160/1160a/1160b may be selectively disposed on the first main surface 1211a or/and the second main surface 1211b, or only confined on each LED die 1100. The first fluorescent layer 1160a may directly contact the LED dies 1100, or the first fluorescent layer 1160a may be separated from the LED dies 1100 by a distance without directly contact. The fluorescent layers 1160/1160a/1160b contain at least one kind of fluorescent powders such as organic fluorescent powder or inorganic fluorescent powder of garnet series, sulfate series or silicate series. The fluorescent layers 1160/1160a/1160b may then be able to at least partially absorb a light beam emitted from the LED die 1100 and covert the light beam into another light beams having different wavelength range. For example, when blue light beams are emitted from the LED die 1100, a part of the blue light beams may be converted into yellow light beams by the fluorescent layers 1160/1160a/1160b, and as a result, the light emitting diode 1 may emit white light beams mixed by the blue light beams and the yellow light beams. Additionally, because the light emitted from the first main surface 1211a mainly comes from light beams directly emitted from the LED die 1100, and the light emitted from the second main surface 1211b comes from light beams passing through the transparent substrate 1200, a luminance of the first main surface 1211a is different from a luminance of the second main surface 1211b. Therefore, concentrations of the fluorescent powders in the first fluorescent layer 1160a and the second fluorescent layer 1160b disposed on the first main surface 1211a and the second main surface 1211b respectively may be the same or different for uniforming the light emitting from the light emitting diode 1. Preferably, a ratio of a fluorescent powder concentration in the first fluorescent layer 1160a to a fluorescent powder concentration in the second fluorescent layer 1160b may range from 1:0.5 to 1:3, or a ratio of the fluorescent powder concentration in the second fluorescent layer 1160b to the fluorescent powders in the first fluorescent layer 1160a may range from 1:0.5 to 1:3. The luminance and the lighting effect of the light emitting diode 1 may become more appropriate for different applications accordingly. In addition, a thickness of the first fluorescent layer 1160a may be the same as or different from a thickness of the second fluorescent layer 1160b, wherein the thickness of the fluorescent layers 1160a/1160b may be greater than 30 um, preferably near or equal to 120 um. A difference in color temperatures of light beams emitted from the first main surface 1211a and the second main surface 1211b may then be controlled to be smaller than or equal to 1500K. A wavelength converting efficiency and light emitting performance of the light emitting diode 1 may then be enhanced.

Figure 11:
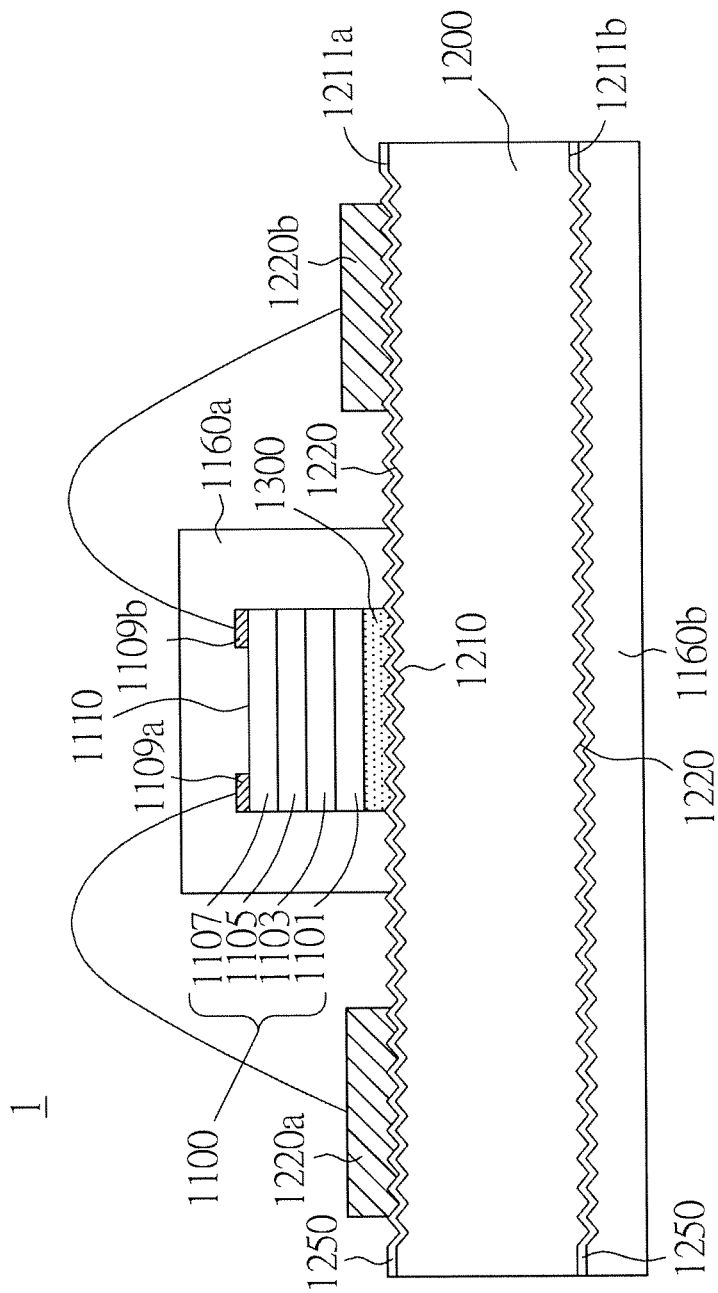
FIG. 11 is a structural schematic diagram according to a seventh preferred embodiment of the present invention.

As shown in FIG. 11, a light emitting diode 1 according to a seventh preferred embodiment of the present invention comprises at least one LED die 1100 providing light in multi-directions, and a first fluorescent layer 1160a and a second fluorescent layer 1160b disposed on the LED die 1100. The LED die 1100 may include a light emitting structure comprising a growth substrate 1101, a first semiconductor layer 1103, a light emitting layer 1105, and a second semiconductor layer 1107; a first electrode 1109a and a second electrode 1109b disposed on the light emitting structure of the LED die 1100; and a transparent substrate 1200 where the light emitting structure disposed on; wherein the growth substrate 1101 and the transparent substrate 1200 may be identical or different. The first electrode 1109a and the second electrode 1109b are electrically connected to the second semiconductor layer 1107 and the first semiconductor layer 1103 respectively (FIG. 11 does not show the connecting relation between the second electrode 1109b and the first semiconductor layer 1103). According to the present invention, the LED die 1100 may be a lateral chip (electrodes 1109/1109a/1109b are disposed on the top of the light emitting structure of the LED die 1100 corresponding to a transparent substrate 1200), a vertical chip (electrodes 1109/1109a/1109b are disposed on the different sides of the light emitting structure of the LED die 1100), or a flip chip (electrodes 1109/1109a/1109b are disposed on the bottom of the light emitting structure of the LED die 1100 and opposite to the transparent substrate 1200). In the seventh embodiment, the LED die 1100 is a lateral chip, and horizontal level of an upper surface of the first electrode 1109a and an upper surface of the second electrode 1109b are substantially the same, and the growth substrate 1101 of the LED die 1100 is attached on the transparent substrate 1200 by such as a die bonding layer 1300. Apart from being used to attach the LED die 1100, a light intensity may also be increased by optimizing the material property of the die bonding layer 1300. For example, a refractive index of the die bonding layer 1300 is preferably between a refractive index of the growth substrate 1101 and a refractive index of the transparent substrate 1200 so as to increase the intensity of light emitted from the LED die 1100. In addition, the die bonding layer 1300 may be a transparent adhesive or other appropriate bonding material. According to the seventh embodiment, the light emitting diode 1 further includes a first connecting metal pad 1120a and a second connecting metal pad 1120b exposed by the first fluorescent layer 1160a. The first connecting metal pad 1120a and the second connecting metal pad 1120b are disposed on the transparent substrate 1200. The first electrode 1109a and the second electrode 1109b may respectively connect to the first connecting metal pad 1120a and the second connecting metal pad 1120b electrically through bonding wires, welding or electric pattern on the transparent substrate 1200. The first fluorescent layer 1160a is disposed on a support surface 1210 of the transparent substrate 1200 and the LED die 1100. Additionally, the second fluorescent layer 1160b may further cover a second main surface 1211b of the transparent substrate 1200. The support surface 1210 and a second main surface 1211b are disposed corresponding to each other on the transparent substrate 1200. A first light emitting surface 1110 of the LED die 1100 uncovered by the transparent substrate 1200 and at least a part of the support surface 1210 without the LED die 1100 form a first main surface 1211a where light emitted from.

In addition, the light emitting diode 1 further comprises a non-planar structure 1220 selectively disposed on the surfaces of the transparent substrate 1200 for increasing the intensity of light emitted from the transparent substrate 1200 and uniforming the distribution of the emitted light. The non-planar structure 1220 may be a convex geometric structure or a concave geometric structure, such as a pyramid, a cone, a hemispheroid, a triangular prism and so forth. The non-planar structures 1220 may be arranged regularly or randomly. Further, the light emitting diode 1 may comprise a diamond-like carbon (DLC) film 1250 selectively disposed on the surfaces of the transparent substrate 1200 so as to enhance the thermal conductive ability and the heat dissipating performance.

Figure 12:
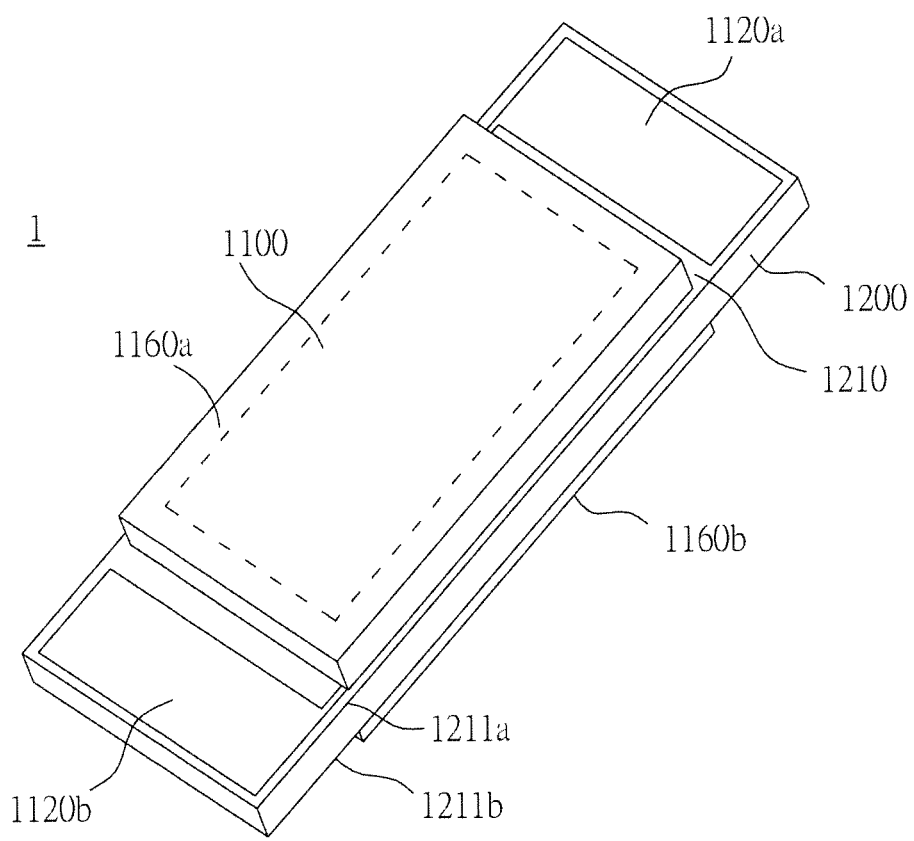
FIG. 12 is a structural schematic diagram according to an eighth preferred embodiment of the present invention.

As shown in FIG. 12, a light emitting diode 1 according to an eighth preferred embodiment of the present invention includes at least one LED die 1100, a first connecting metal pad 1120a, a second connecting metal pad 1120b, a first fluorescent layer 1160a and a second fluorescent layer 1160b. The LED die 1100 comprise a transparent substrate 1200 and a light emitting structure disposed on the support surface 1210 of the transparent substrate 1200. A first main surface 1211a where light emitted from comprises a first light emitting surface 1110 of the LED die 1100 and at least a part of the support surface 1210 uncovered by the light emitting structure of the LED die 1100. In this embodiment, the LED die 1100 has a beam angle greater than 180 degrees, and at least a part of light beams emitted from the LED die 1100 penetrate into the transparent substrate 1200. At least a part of the penetrating light beams may be emitted from a second main surface 1211b which is corresponding to the first main surface 1211a, and the other penetrating light beams may be emitted from other surfaces of the transparent substrate 1200, so as to form the light emitting diode 1 providing light in multi-directions. The first connecting metal pad 1120a and the second connecting metal pad 1120b are respectively disposed on different sides of the transparent substrate 1200 or on the same side of the transparent substrate 1200 (not shown in FIG. 12). The first connecting metal pad 1120a and the second connecting metal pad 1120b may respectively form extension parts connected with an electric pattern on the transparent substrate 1200, and the first connecting metal pad 1120a and the second connecting metal pad 1120b are electrically connected to the LED die 1100 accordingly. The first fluorescent layer 1160a covers the LED die 1100 and exposes the first and second connecting metal pads 1120a/1120b. The first and second fluorescent layers 1160a/1160b at least partially absorb a light beam emitted from the LED die 1100 or/and the transparent substrate 1200, and coverts the light beam into a light beam having another wavelength range. The converted light and the light which are not absorbed by the fluorescent layers 1160a/1160b are mixed to extend the total wavelength range of the light beams emitted from the light emitting diode 1 and improve the light emitting performance of the light emitting diode 1. Because the light emitting diode 1 in this embodiment includes the first connecting metal pad 1120a and the second connecting metal pad 1120b respectively disposed on the transparent substrate 1200, traditional or further LED die packaging process may be omitted and the light emitting diode 1 may be independently manufactured and then combined with an appropriate supporting base. Accordingly, the total manufacturing yield may be improved, the structure may be simplified and applications of the corresponding supporting base may also be increased.

Figure 13:
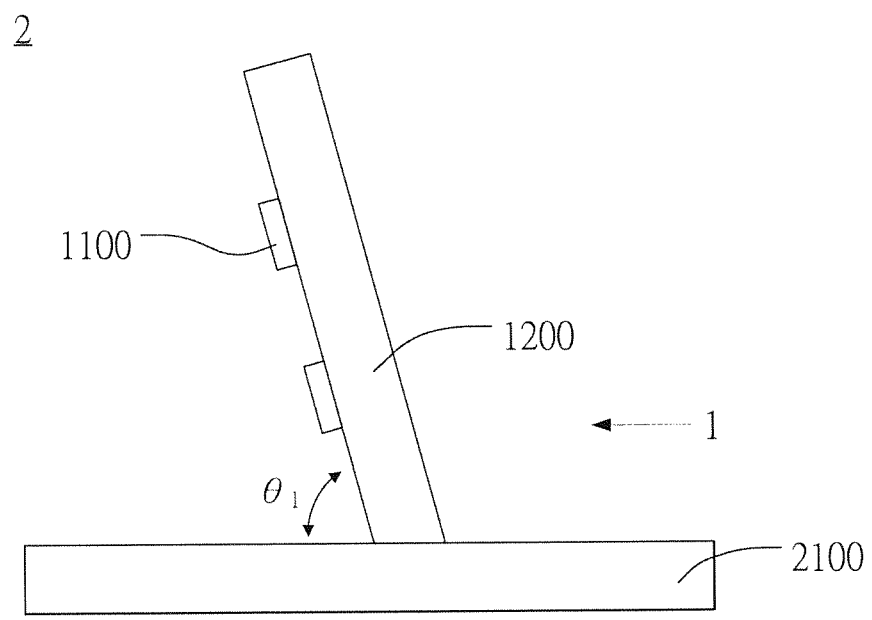
FIG. 13 is a structural schematic diagram according to a ninth preferred embodiment of the present invention.

As shown in FIG. 13, an illumination device 2 according to a ninth preferred embodiment of the present invention comprises a supporting base 2100 and a light emitting diode 1 as described in the above embodiments. A transparent substrate 1200 of the LED die 1100 may stand on (or lie on) and be electrically coupled to the supporting base 2100. A first angle θ1 exists between the transparent substrate 1200 and the supporting base 2100. The first angle θ1 may be fixed or be adjusted according to the light shape requirement of the illumination device 2. Preferably, the first angle θ1 ranges from 30 degrees to 150 degrees. The LED die 1100 may be electrically connected to the supporting base directly via the first connecting metal pad 1120a and the second connecting metal pad 1120b (not shown in FIG. 14), and a power supply may provide electricity to the LED die 1100 via the supporting base 2100.

Figure 14:
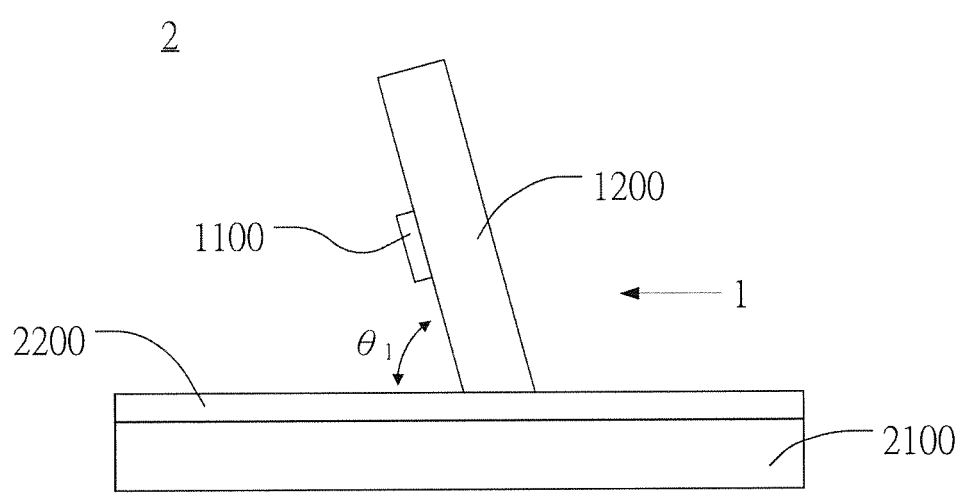
FIG. 14 is a structural schematic diagram according to a tenth preferred embodiment of the present invention.

As shown in FIG. 14, an illumination device 2 according to a tenth preferred embodiment of the present invention comprises a supporting base 2100 and a light emitting diode 1 as described in the above embodiments. The supporting base 2100 further includes a circuit board 2200 electrically coupled to a power supply. The circuit board 2200 may electrically couple to a first connecting metal pad 1120a and a second connecting metal pad 1120b (not shown in FIG. 14) so as to electrically connect to the LED die 1100. The power supply may then provide electricity via the circuit board 2200 to the LED die 1100 for emitting light.

Figure 15:
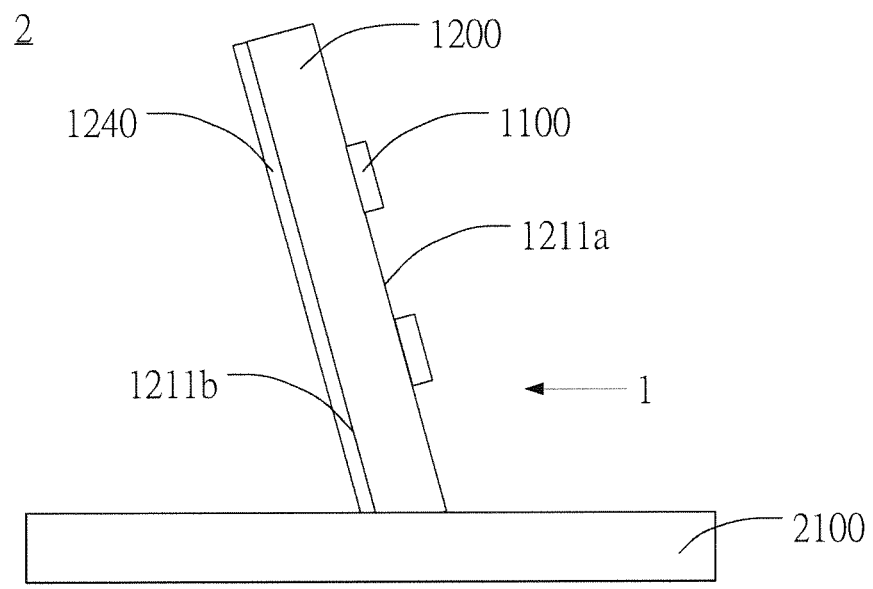
FIG. 15 is a structural schematic diagram according to an eleventh preferred embodiment of the present invention.

As shown in FIG. 15, an illumination device 2 according to a eleventh preferred embodiment of the present invention comprises a supporting base 2100 and a light emitting diode 1 as described in the above embodiments. The illumination device 2 of this embodiment further includes a reflector or filter 1240 disposed on a second main surface 1211b or a support surface 1210 of a transparent substrate 1200 of an LED die 1100 comprised in the light emitting diode 1. The reflector or filter 1240 may reflect at least a part of light beams emitted from the LED die 1100 and passing through the transparent substrate 1200, and at least a part of the reflected light beams may emerge from a first main surface 1211a of the light emitting diode 1. The reflector 1240 may include at least one metal layer or a Bragg reflector, but not limited thereto. The Bragg reflector may be composed of a plurality of insulating thin films with different refractive indexes disposed in a stack configuration, or the Bragg reflector may be composed of a plurality of insulating thin films with different refractive indexes and a plurality of metal oxide layers disposed in a stack configuration.

Figure 16:
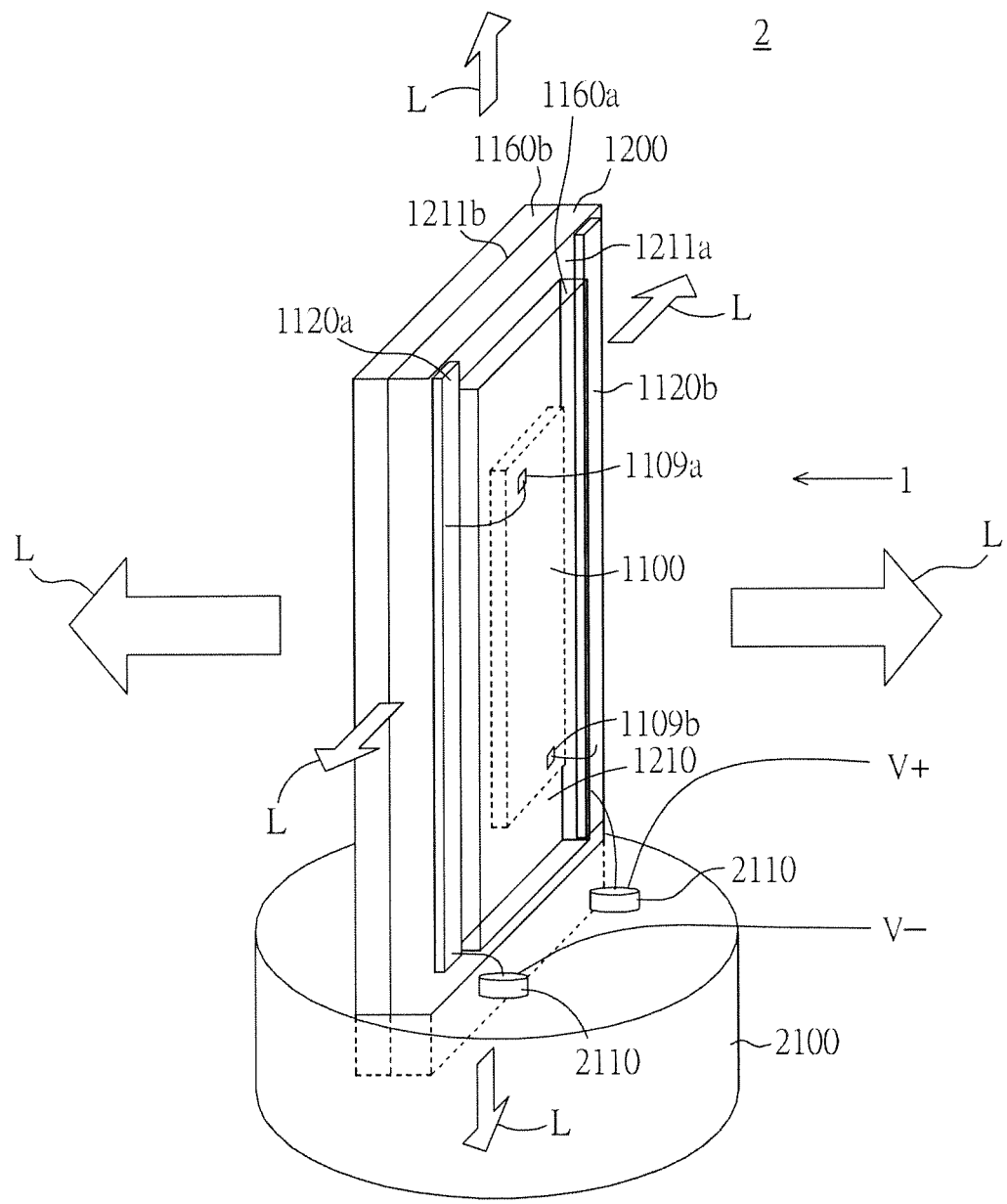
FIG. 16 is a structural schematic diagram according to a twelfth preferred embodiment of the present invention.

As shown in FIG. 16, an illumination device 2 according to a twelfth preferred embodiment of the present invention includes a supporting base 2100 and a light emitting diode 1 as described in the above embodiments. The light emitting diode 1 may be at least partially embedded into the supporting base 2100. The illumination device 2 may further comprise unit bonding pads 2110 on the supporting base 2100 and electrically connecting to at least one of LED dies 1100 of the light emitting diode 1. Driving voltage V+ and V− may be accordingly provided through the unit bonding pads 2110 respectively to the LED die 1100 for emitting the light beam L. The LED die 1100 includes a first electrode 1109a and a second electrode 1109b respectively and electrically connected to a first connecting metal pad 1120a and a second connecting metal pad 1120b. The LED die 1100 may have a beam angle greater than 180 degrees or has a plurality of light emitting surfaces, and then the illumination device 2 may emit light beams from a first main surface 1211a and a second main surface 1211b of the light emitting diode 1. Further, because some of the light beams may be emitted directly from the LED die 1100 and/or surfaces of a transparent substrate 1200 of the LED die 1100, the illumination device 2 may accordingly emit light from multi sides or six sides or in full directions.

The light emitting diode 1 may further include a first and second fluorescent layers 1160a/1160b selectively disposed on the LED die 1100, the first main surface 1211a or the second main surface 1211b. The fluorescent layers 1160a/1160b may at least partially absorb a light beam emitted from the LED die 1100 and covert the light beam into another light beam having different wavelength range so as to emit light with specific color or light having a wider wavelength range from the illumination device 2. The transparent substrate 1200 may be vertically fixed on the supporting base 2100 by mounting a side wall of the transparent substrate 1200 with the supporting base 2100 directly, or the transparent substrate 1200 may be horizontally disposed on the supporting base 2100, but not limited thereto. The transparent substrate 1200 preferably includes materials with high thermal conductivity, and heat generated from the LED die 1100 may be accordingly dissipated to the supporting base 2100 through the transparent substrate 1200, such that the LED dies 1100 which are high power can be applied in the illumination device 2 of the present invention accordingly. However, in a preferred embodiment of the present invention, at the same power consumption of the illumination device 2, more LED dies 1100 with relatively low power are dispersed on the transparent substrate 1200 so as to fully utilize the thermal conductivity capability of the transparent substrate 1200. For example, the LED die 1100 in this embodiment may be equal to or lower than 0.2 watt, but not limited thereto.

Figure 17:
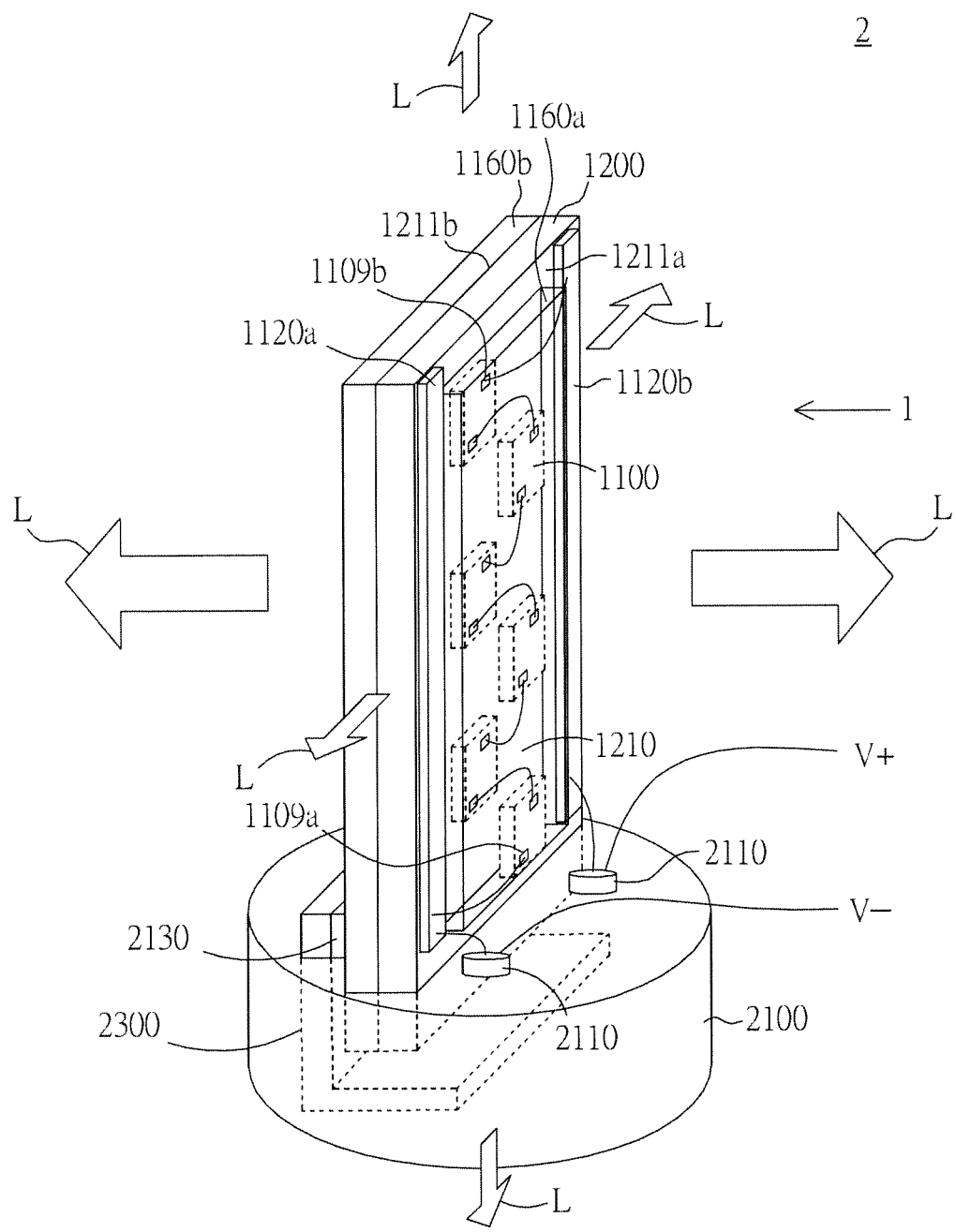
FIG. 17 is a structural schematic diagram according to a thirteenth preferred embodiment of the present invention.

As shown in FIG. 17, in contrast to the embodiment as shown in FIG. 16, an illumination device 2 according to a thirteenth preferred embodiment of the present invention includes a light emitting diode 1 as described in the above embodiments, and a support 2300 configured to connect the light emitting diode 1 and a supporting base 2100. A transparent substrate 1200 of the light emitting diode 1 is fixed on a side of the support 2300 by a unit bonding layer 2130, and another side of the support 2300 may be disposed on or inserted into the supporting base 2100. Additionally, the support 2300 is flexible so as to form an angle between the transparent substrate 1200 and the supporting base 2100, and the angle ranges from 30 degrees to 150 degrees. The support 2300 may include a material selected from aluminum, composite metallic material, copper conductor, electric wire, ceramic substrate, printed circuit board, or other appropriate materials.

Figures 18, 19:
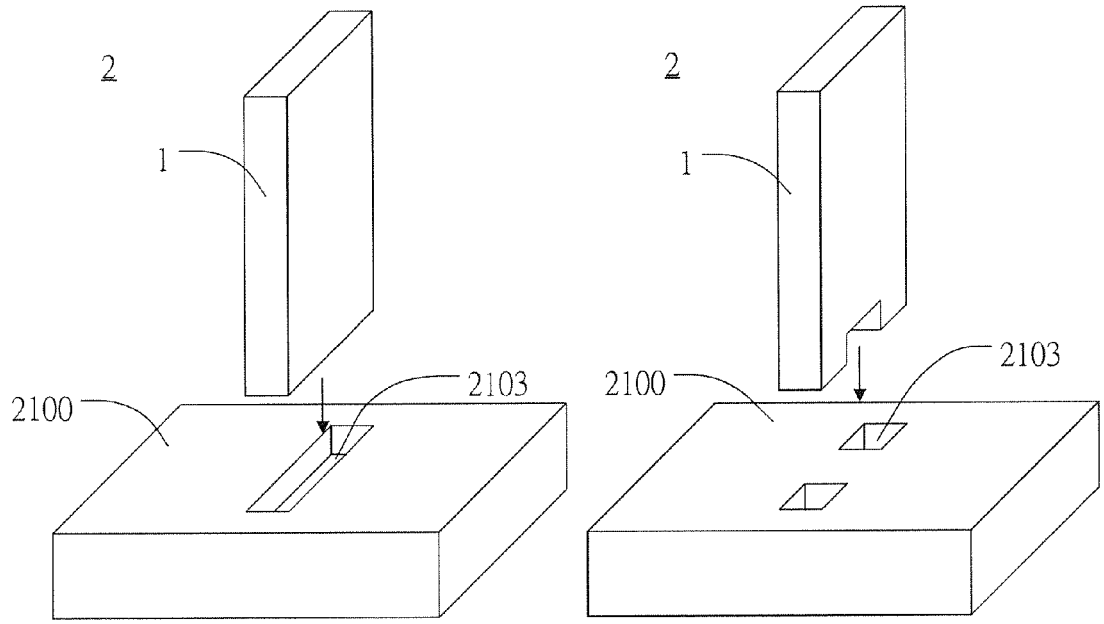
FIGS. 18-20 are structural schematic diagrams according to a fourteenth preferred embodiment of the present invention.
Figure 20:
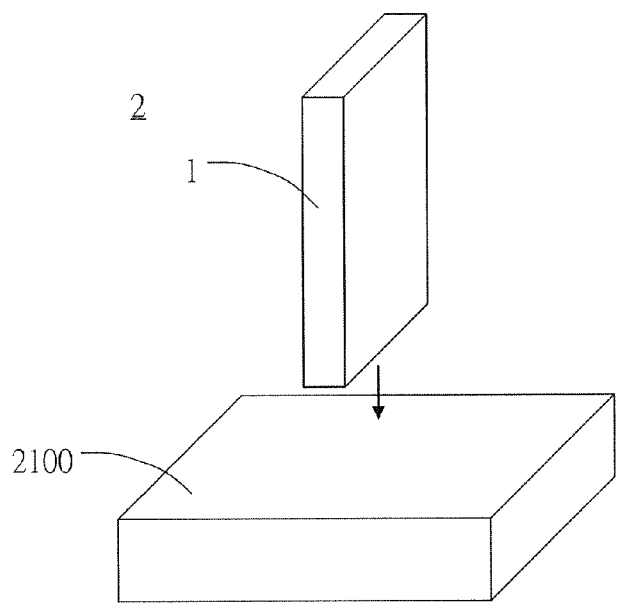

As shown in FIGS. 18-20, in contrast to the above embodiments, an illumination device 2 according to a fourteenth preferred embodiment of the present invention may comprise a light emitting diode 1 as described in the above embodiments, and the light emitting diode 1 may plug into at least a socket 2103 of or directly bond with a supporting base 2100 of the illumination device 2. The light emitting diode 1 may electrically couple with an electric power source through the socket 2103, and comprises a plurality of LED dies 1100 having a transparent substrate 1200 and electrically coupling with connecting metal pads 1120a/1120b on the transparent substrate 1200. The connecting metal pads 1120a/1120b may respectively extend to an edge of the transparent substrate 1200 and integrate into an connecting finger having a plurality of conductive contact sheets. When the light emitting diode 1 is inserted into the socket 2103, the LED dies 1100 may electrically couple with the supporting base 2100 through the connecting metal pads 1120a/1120b and unit bonding pads 2110 of the supporting base 2100, and the light emitting diode 1 may be fixed by the socket 2103 of the supporting base 2100 accordingly. As shown in FIG. 19, the light emitting diode 1 may insert into multi sockets of the supporting base 2100. In this embodiment, the transparent substrate 1200 of the light emitting diode 1 has a dual-pin structure. One of the pins may be configured as a positive electrode of the diode 1, and another one of the pins may be configured as a negative electrode of the diode 1. Each pin may have at least one conductive contact sheet so as to act as connecting ports. Accordingly, the sockets 2103 may have corresponding shape and size with the pins so as to smoothly insert the transparent substrate 1200 into the supporting base 2100 and provide electricity to the LED dies 1100. As shown in FIG. 20, the light emitting diode 1 may be bonded to the supporting base 2100 by the unit bonding layer 2130 as described in the above embodiments. In the bonding process, for using in combining or welding the transparent substrate 1200 and the supporting base 2100, the unit bonding layer 2130 may comprise at least a material selected from gold, tin, indium, bismuth, silver, conductive silica gel or epoxy. The light emitting diode 1 may then be electrically connected to the supporting base 2100 via the connecting metal pads 1120a/1120b and the unit bonding layer 2130 accordingly.

Figure 21:
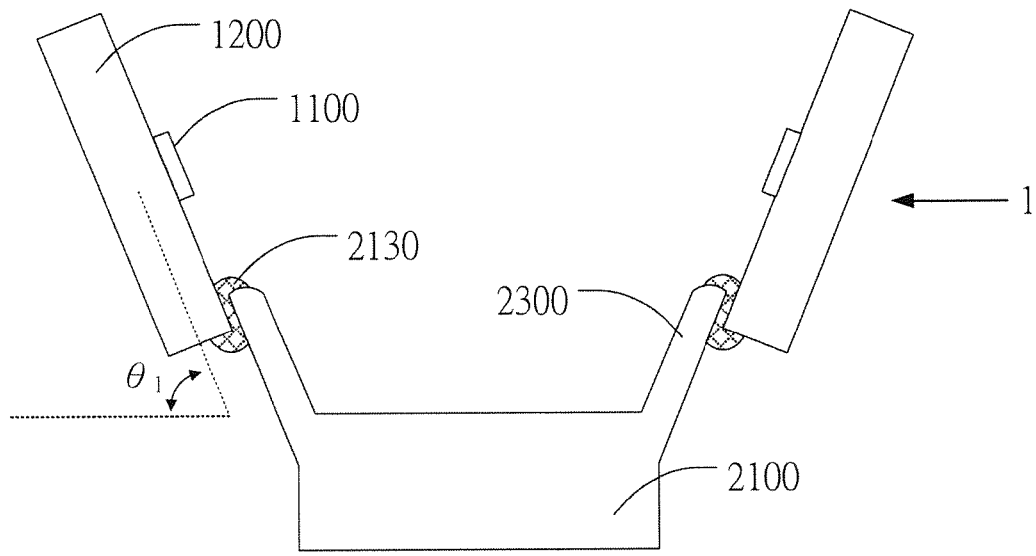
FIGS. 21-22 are structural schematic diagrams according to a fifteenth preferred embodiment of the present invention.
Figure 22:
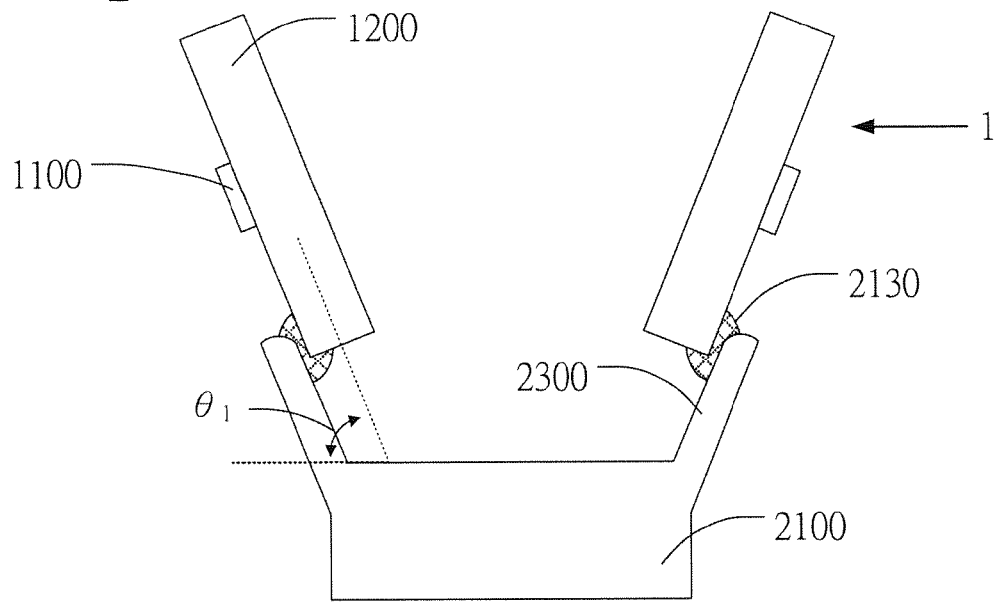

As shown in FIG. 21 and FIG. 22, a supporting base 2100 of an illumination device 2 according to a fifteenth preferred embodiment of the present invention may comprise a material selected from aluminum, copper, iron, silver, gold, nickel, ceramic or printed circuit board, and have two supports 2300 on a surface or edge of the supporting base 2100. The illumination device 2 may further comprise two light emitting diodes 1 as described in the above embodiments, and a first angle θ1 between one of the light emitting diodes 1 and a top surface of the supporting base 2100 ranging from 30 degrees to 150 degrees, wherein the light emitting diodes 1 are electrically coupled with and fixed on the corresponding supports 2300 through unit bonding layers 2130. A first main surface 1211a of the light emitting diode 1 may face toward the supporting base 2100 or not. The support 2300 may be separated from or integrated with the supporting base 2100, and preferably the supporting base 2100 or the support 2300 are flexible, which means the first angle θ1 may be adjustable for applying the present invention to different applications. In some embodiments, at least one of the light emitting diodes 1 may be disposed on the top surface of the supporting base 2100 so as to enhance the lighting performance of the illumination device 2. Moreover, the illumination device 2 may comprise at least two light emitting diodes 1, wherein the light color of the light emitting diodes 1 are different, and the color variety of the illumination device 2 may then be enhanced for different demands.

Figure 23:
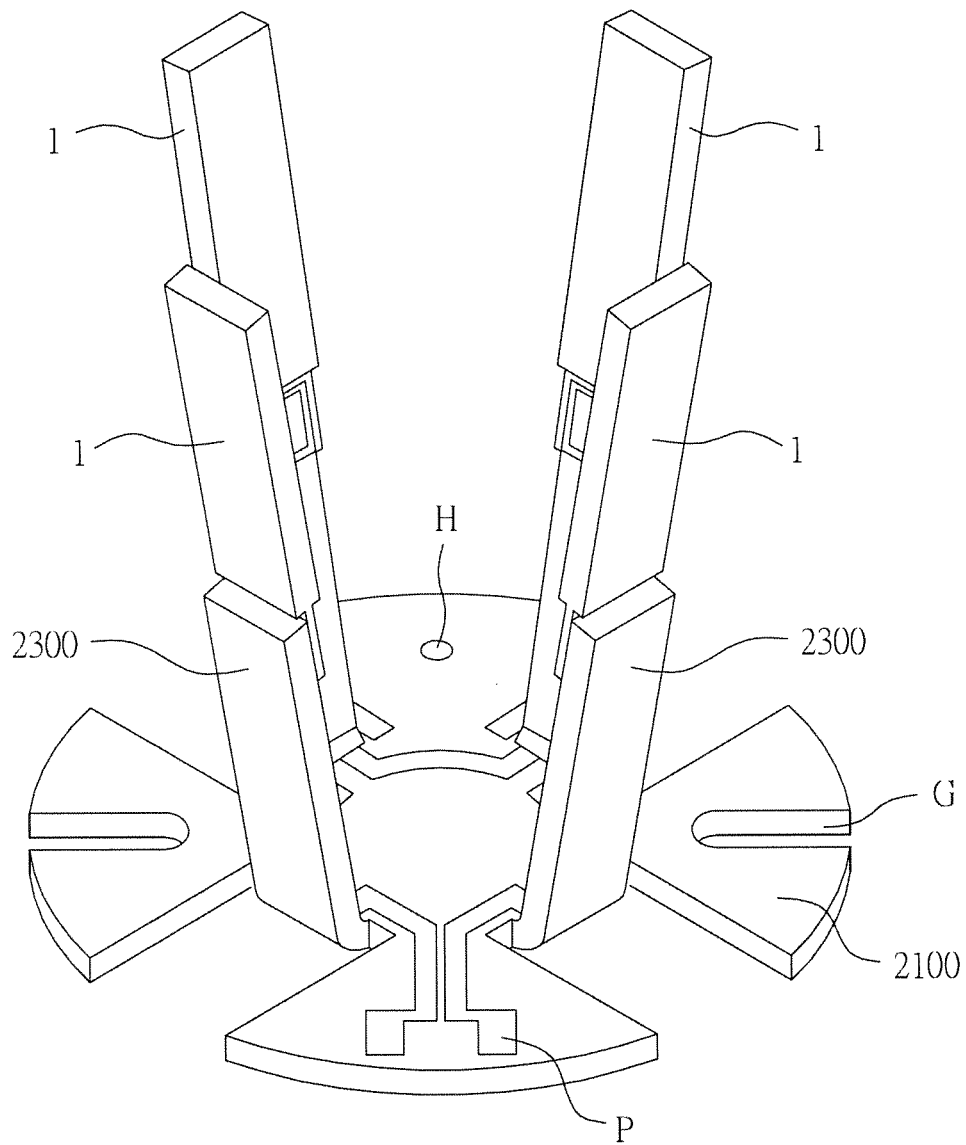
FIG. 23 is a structural schematic diagram according to a sixteenth preferred embodiment of the present invention.

As shown in FIG. 23, an illumination device 2 according to a sixteenth preferred embodiment of the present invention may comprise four light emitting diodes 1 and a supporting base 2100 as described in the above embodiments. The supporting base 2100 may further include four supports 2300 and a circuit pattern P. An end of the light emitting diode 1 is electrically coupled with the support 2300 to avoid or reduce the light shielding influence caused by the support 2300. The support 2300 may be formed by cutting and bending a part of the supporting base 2100, and there may be an angle between the support 2300 and the supporting base 2100 ranging like the first angle θ1 as described in the above embodiments. The circuit pattern P may be disposed on the top surface of the supporting base 2100, and have at least an electric port set for electrically connecting to an electric power source. At least a part of the circuit pattern P may extend to the support 2300 to electrically connect the light emitting diode 1. The light emitting diode 1 may then be electrically connected to the electric power source via the circuit pattern P of the supporting base 2100. In addition, the supporting base 2100 may further include at least a hole H or at least a gap G, and fixing devices such as screws, nails or bolts may be used to combine the supporting base 2100 with other device via the hole H or the gap G. Meanwhile, the hole H or the gap G may also increase the heat radiating area and enhance the heat dissipation capability of the illumination device 2 according to the present invention.

Figure 24:
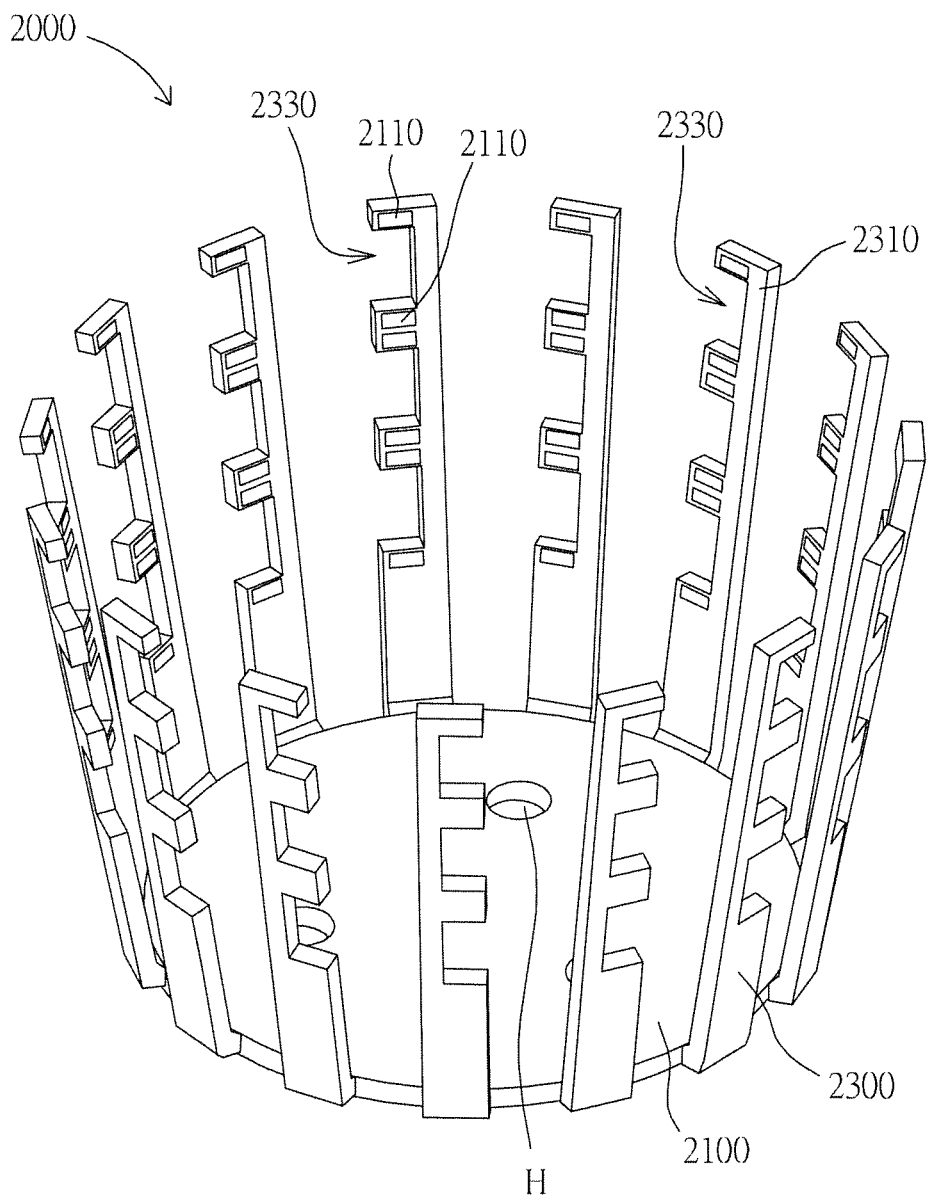
FIG. 24 is a structural schematic diagram according to a seventeenth preferred embodiment of the present invention.

As shown in FIG. 24, a device frame 2000 according to a seventeenth preferred embodiment of the present invention may include a supporting base 2100 as described in the above embodiments, and a plurality of supports 2300 connected with the supporting base 2100. The support 2300 includes a stick part 2310 and an opening 2330. At least two unit bonding pads 2110 are respectively disposed on two sides of the opening 2330. The stick part 2310 forms at least one wall of the opening 2330. A light emitting diode 1 as described in the above embodiments is disposed on the support 2300 corresponding to the opening 2330, and connecting metal pads 1120a/1120b of the light emitting diode 1 are electrically connected to the unit bonding pads 2110 so as to drive the light emitting diode 1 by an electric power source via the support 2300 and a circuit pattern of the supporting base 2100. A size of the opening 2330 may not be smaller than an area occupied by a fluorescent layer 1160/1160a/1160b of the light emitting diode 1 so as to prevent light beams emitted from the light emitting diode 1 from being blocked by the support 2300. A connection part between the support 2300 and the supporting base 2100 may be adjustable so as to adjust an angle between the support 2300 and the supporting base 2100 for different applications.

Figure 25:
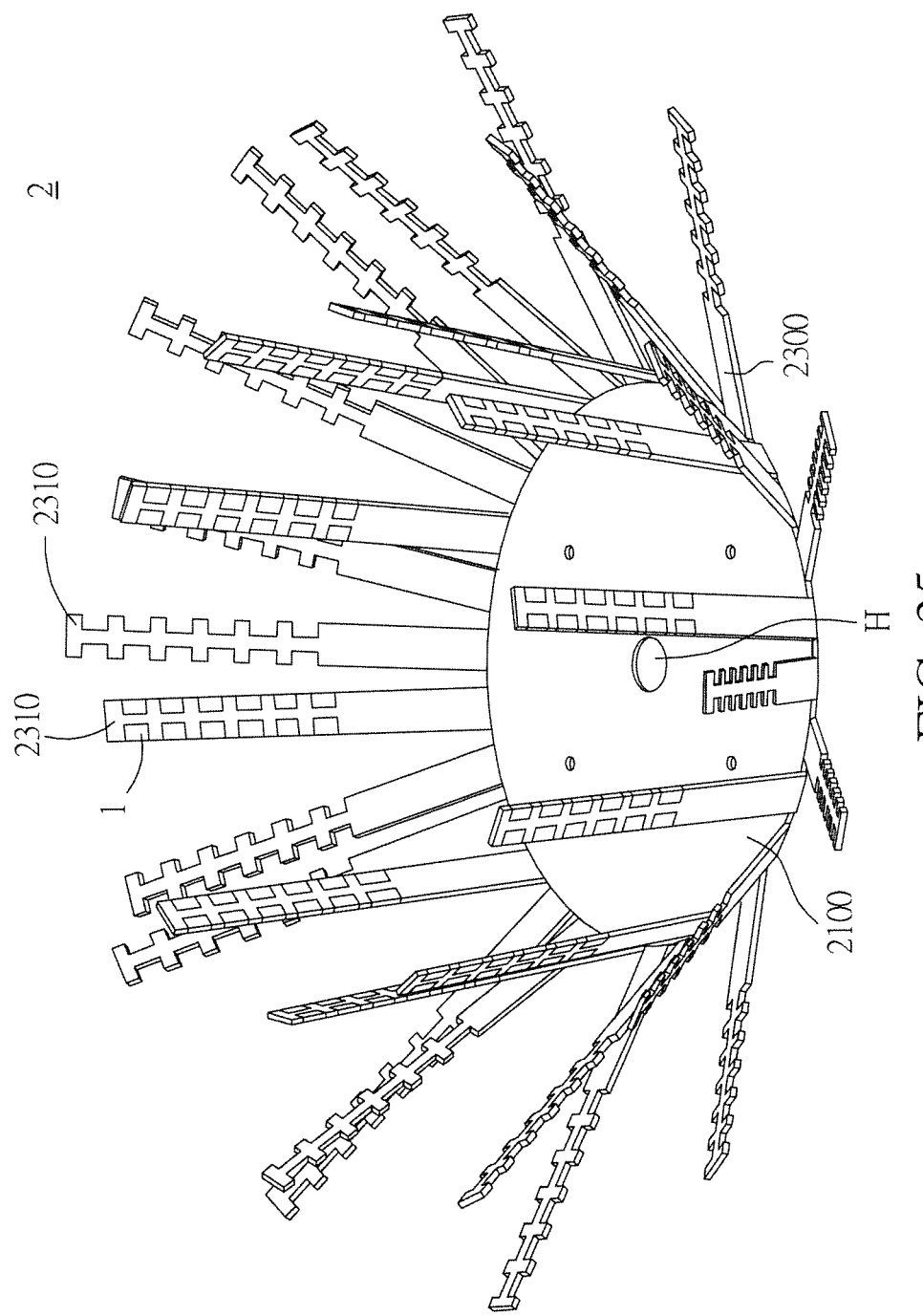
FIG. 25 is a structural schematic diagram according to an eighteenth preferred embodiment of the present invention.

As shown in FIG. 25, an illumination device 2 according to an eighteenth preferred embodiment of the present invention may include a plurality of light emitting diodes 1, as described in the above embodiments, and a plurality of supports 2300, wherein each of the supports 2300 has a plurality of openings 2330. The openings 2330 are respectively disposed on two opposite sides of the support 2300, and a stick part 2310 of the support 2300 forms at least one wall of each opening 2330. The light emitting diode 1 is disposed on the support 2300 correspond to the opening 2330, and a conductive pattern or connecting metal pads 1120a/1120b of the light emitting diode 1 (not shown in FIG. 25) are respectively electrically connected to corresponding unit bonding pads 2110 disposed near the opening 2330. A length of the support 2300 may substantially range from 5.8 to 20 um. Angles between the supporting base 2100 and the supports 2300 with the light emitting diodes 1 may be modified respectively. In other words, an angle between the supporting base 2100 and at least one of the supports 2300 may be different from an angle between the supporting base 2100 and another one of the supports 2300. Additionally, the light emitting diodes 1 having different wavelength ranges may be disposed on the identical support 2300 or respectively on the different supports 2300 so as to enrich the color effect of the illumination device 2.

As shown in FIGS. 26-29, an illumination device 2 according to a nineteenth preferred embodiment of the present invention may comprise light emitting diodes 1, as described in the above embodiments, disposed on a supporting structure 2100 having different shape from top view. For enhancing the luminance and improving the light emitting effect, a plurality of the light emitting diodes 1 may be disposed on the supporting bases 2100 point-symmetrically or line-symmetrically. As shown in FIG. 26, the light emitting diodes 1 are point-symmetrically arranged and form an angle between each other in 90 degrees from top view. Therefore, at least two of the light emitting diodes 1 may face toward the same direction. As shown in FIG. 27, the angle between the light emitting diodes is smaller than 90 degrees. As shown in FIG. 28, the light emitting diodes 1 may be disposed around and parallel to the edge of a top surface of the supporting base 2100. As shown in FIG. 29, the angle between the light emitting diodes 1 is larger than 90 degrees. In some other embodiments according to the present invention (not shown in the figures), the light emitting diodes 1 may be asymmetrically disposed, and at least a part of the light emitting diodes 1 may be disposed in a crowd or separately so as to perform different lighting shape for different applications.

Figure 30:
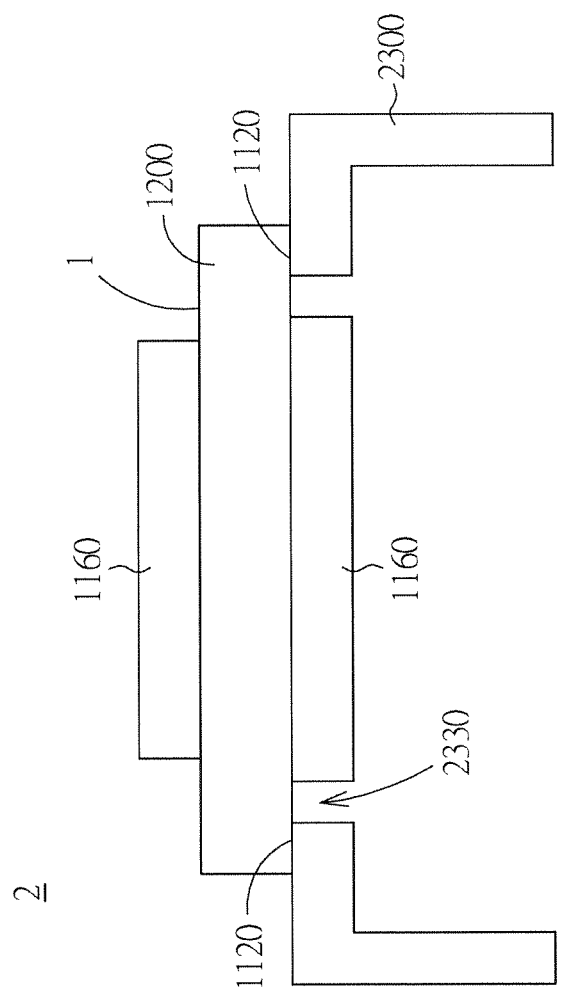
FIG. 30 is a structural schematic diagram according to a twentieth preferred embodiment of the present invention.

As shown in FIG. 30, an illumination device 2 according to a twentieth preferred embodiment of the present invention may include a light emitting diode 1 as described in the above embodiments, and a support 2300 where the light emitting diode 1 disposed on. The support 2300 includes an opening 2330, and the light emitting diode 1 is disposed corresponding to the opening 2330. In this embodiment, an external part of the support 2300 may be work as a pin or be bent to form a connecting pad required in surface mounting process, so that the illumination device 2 may be fixed and electrically connected to other electrical circuit units. A fluorescent layer 1160 of the light emitting diode 1 is disposed in the opening 2330, and then the illumination device 2 may emit light from multi sides or six sides accordingly.

Figure 31:
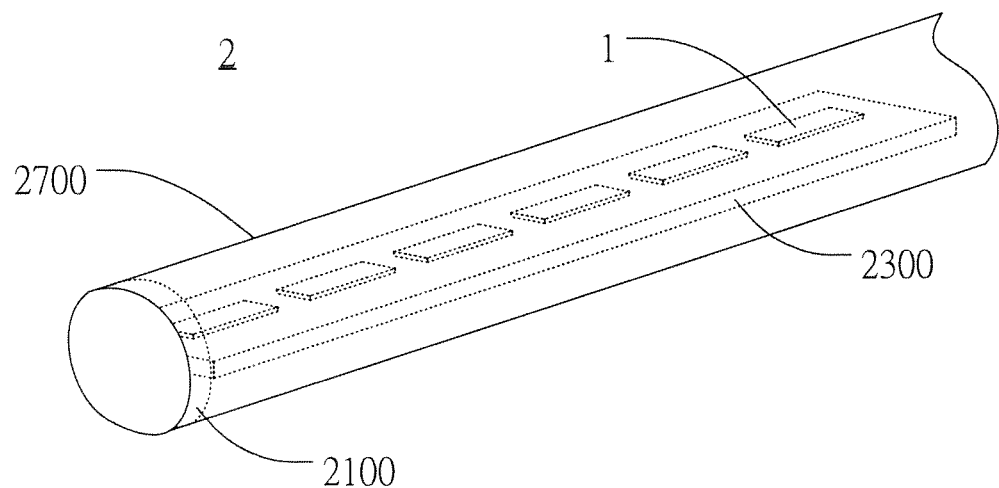
FIG. 31 and FIG. 32 are structural schematic diagrams according to a twenty-first preferred embodiment of the present invention.
Figure 32:
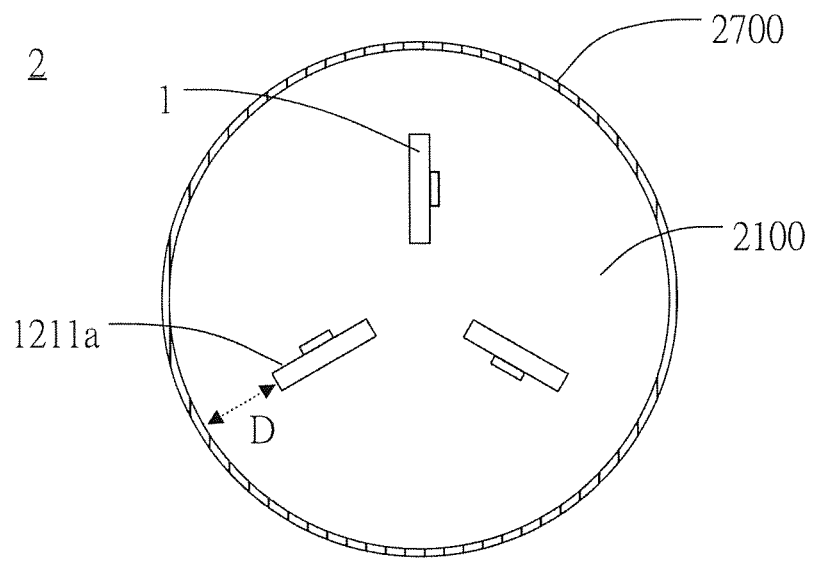

As shown in FIGS. 31 and 32, an illumination device 2 according to a twenty-first preferred embodiment of the present invention may include a light emitting diode 1, as described in the above embodiments, disposed on a support 2300 of a supporting structure 2100, and a lamp housing 2700 having a tube shape and covering at least a part of the light emitting diode 1. As shown in FIG. 32, the illumination device 2 may comprise a plurality of light emitting diodes 1 disposed in the lamp housing 2700, and the first main surfaces 1211a of the light emitting diodes 1 are arranged separately and not parallel to one another. Additionally, the light emitting diodes 1 are at least partially disposed in space formed by the lamp housing 2700, and the light emitting diodes 1 are not closely adjacent to an inner wall of the lamp housing 2700. Preferably, a distance D between the light emitting diode 1 and the lamp housing 2700 may be equal to or larger than 500 micrometers. However, the lamp housing 2700 may also be formed by filling glue process and directly contact with the light emitting diodes 1.

Figure 33:
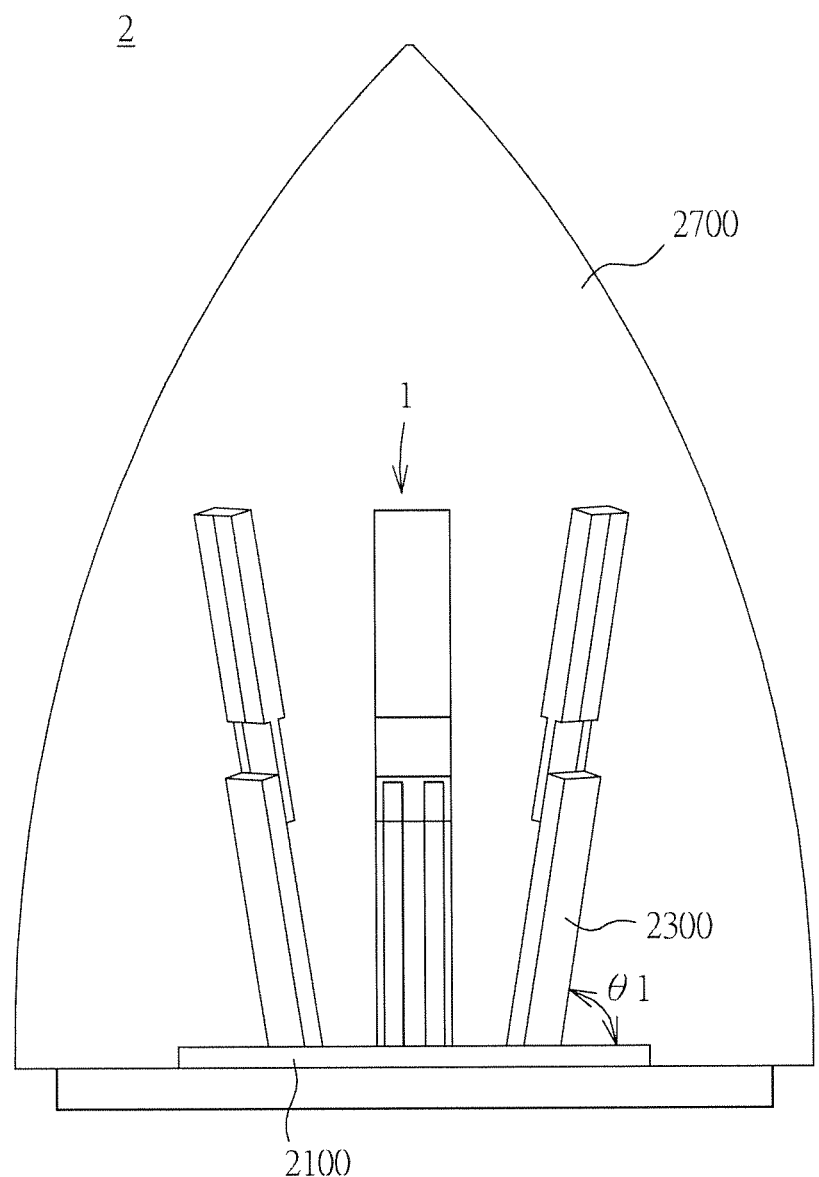
FIG. 33 is a structural schematic diagram according to a twenty-second preferred embodiment of the present invention.
Figure 34:
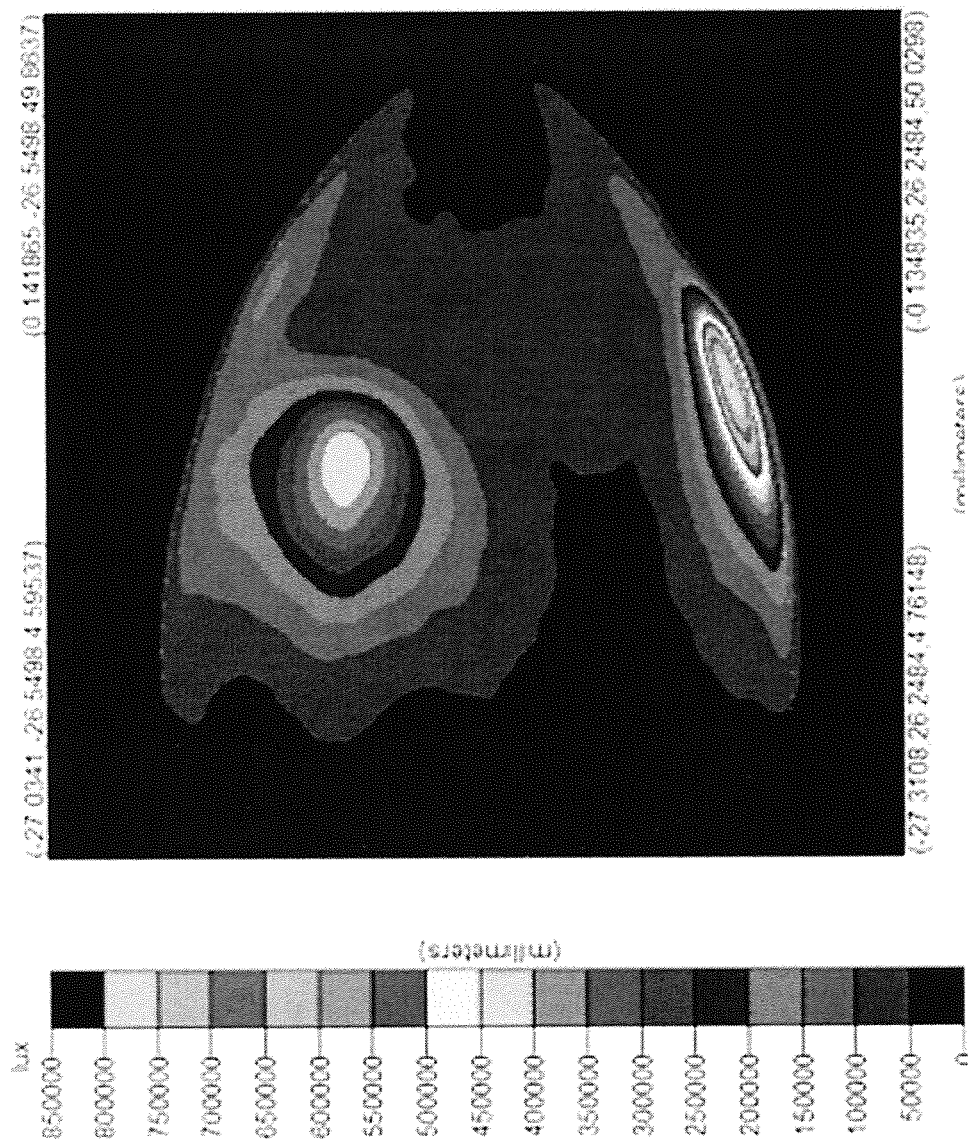
FIG. 34 is an illumination map of the illumination device according to the twenty-second preferred embodiment of the present invention.

As shown in FIG. 33, an illumination device 2 according to a twenty-second preferred embodiment of the present invention may comprise at least three light emitting diodes 1, as described in the above embodiments, disposed on supports 2300 and arranged around a symmetrical center of a supporting base 2100, wherein each of the light emitting diodes 1 may comprise at least a major light emitting surface facing toward a symmetrical center 2101 of the supporting base 2100. A first angle θ1 between the light emitting diode 1 and the supporting base 2100 may substantially range from 30 degrees to 150 degrees. The illumination device 2 may further comprise a candle like housing 2700 entirely covering the light emitting diodes 1, supports 2300, and coupling with the supporting base 2100. Because the light of the illumination device 2 may not be uniform when the first angle θ1 is equal or close to 90 degrees, there is another embodiment that the first angle θ1 is preferably equal or close to 60 degrees or 80 degrees, which may be varied according to the light emitting diode 1 and the housing 2700 used for different applications, and an illumination map of the illumination device 2 according to this embodiment may refer to FIG. 34.

Figure 35:
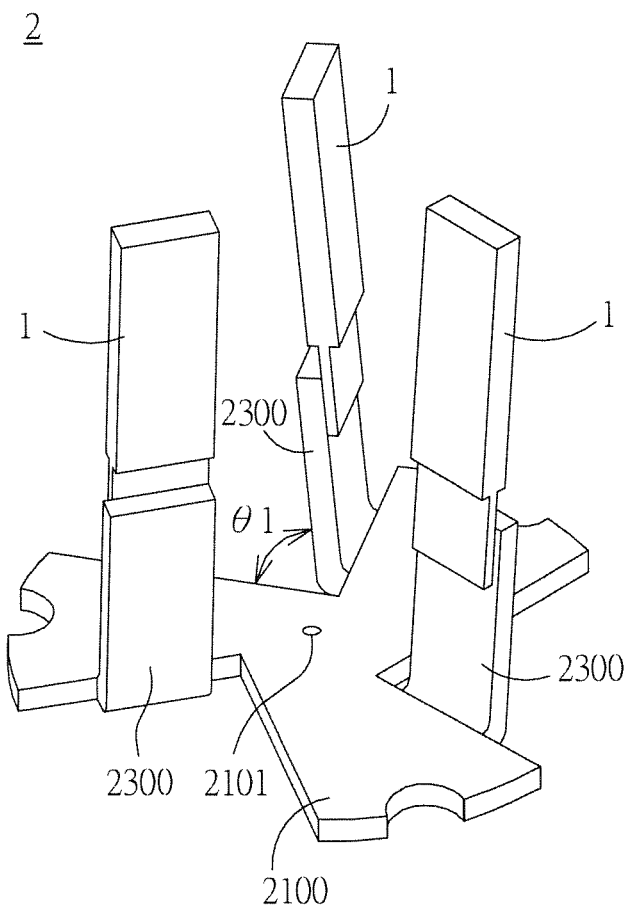
FIGS. 35-36 are a structural schematic diagram according to a twenty-third preferred embodiment of the present invention.
Figure 36:
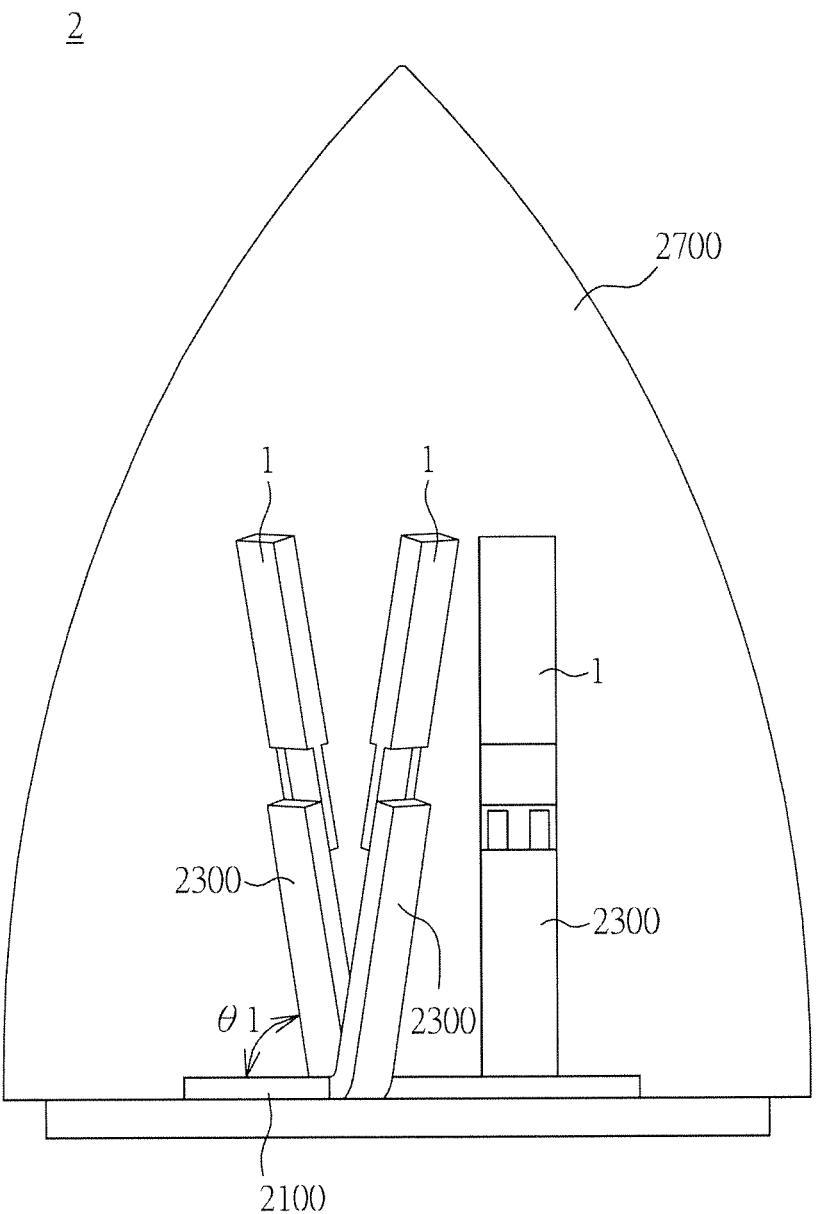
Figure 37:
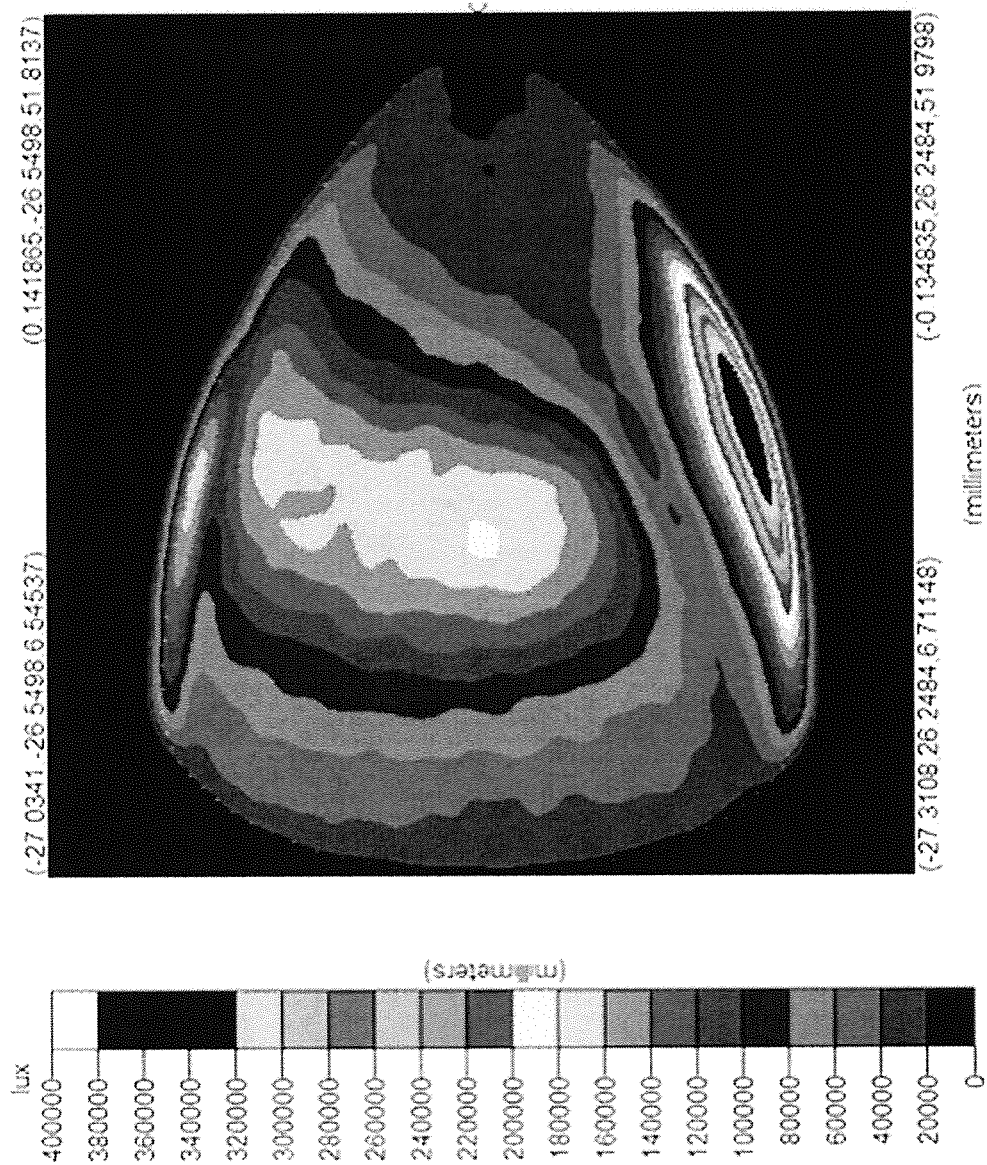
FIG. 37 is an illumination map of the illumination device according to the twenty-third preferred embodiment of the present invention.

Because the light of the illumination device 2 according to the above embodiments may be not uniform enough, there are further improved embodiments according to the invention. As shown in FIGS. 35-36, an illumination device 2 according to a twenty-third preferred embodiment of the present invention may comprise at least two supports 2300 bent relative to a supporting base 2100 and not oriented toward a symmetrical center 2101 of the supporting base 2100, and at least two light emitting diodes 1, as described in the above embodiments, respectively disposed on the corresponding supports 2300, wherein the major light emitting surface of the light emitting diodes 1 may not face toward the symmetrical center 2101 of the supporting base 2100. The supporting base 2100 may be shaped like a star or wheel, and comprise at least two fins, wherein the support 2300 may extend from one side of the fin. Such that the distribution of light emitting diodes 1 disposed on the supports 2300 may be closer, and the intensity of light emitting from the illumination device 2 can be improved. The illumination 2 according to this embodiment may further comprise a candle like housing 2700 entirely covering the light emitting diodes 1, supports 2300, and coupling with the supporting base 2100. Preferably, when the quantity of the light emitting diodes 1 is equal to three, and the height of the housing 2700 is equal or close to 51.39 mm and the interdiameter of the bottom of the housing 2700 is equal or close to 34.92 mm, the distance between the support 2300 and the symmetrical center 2101 of the supporting base 2100 may range from 2 mm to 3 mm, and the length of the support 2300 may range from 5 mm to 15 mm. In addition, a first angle θ1 between the light emitting diode 1 and the supporting base 2100 is preferably equal or close to 80 degrees and the length of the support 2300 is preferably equal or close to 13.6 mm. As shown in the illumination map in FIG. 37, the light of the illumination device 2 according to this preferable embodiment may be more uniform than the above embodiment shown in FIG. 33 and FIG. 34. Wherein the light beam emitted from the light emitting diode 1 can compensate the shadow, and the light beam can be averagely distributed without dark zone. There is another preferable embodiment which can reach the similar lighting effect as described above, that the first angle θ1 is preferably equal or close to 80 degrees, the length of the support 2300 is preferably equal or close to 15 mm and the distance between the support 2300 and the symmetrical center 2101 of the supporting base 2100 is preferably equal or close to 2 mm. In some embodiments of the present invention, the at least two light emitting diodes 1 may be arranged parallel or nonparallel to each other alternatively according to different application.

Figure 38:
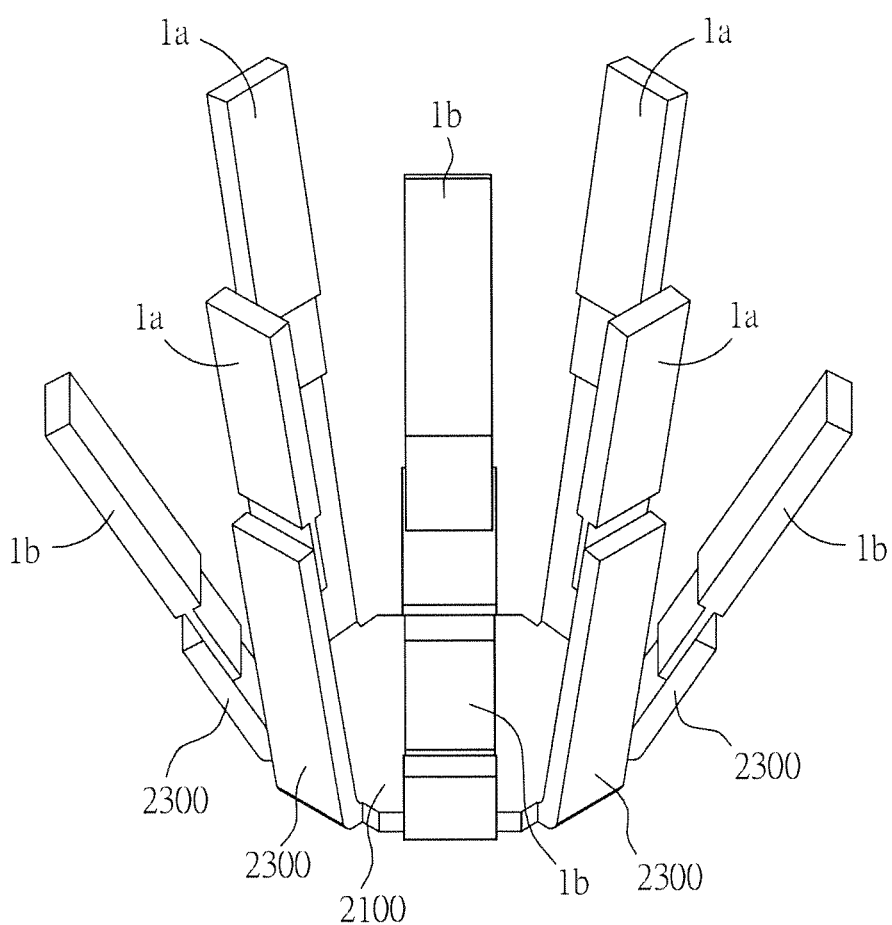
FIGS. 38-39 are structural schematic diagrams according to a twenty-fourth preferred embodiment of the present invention.
Figure 39:
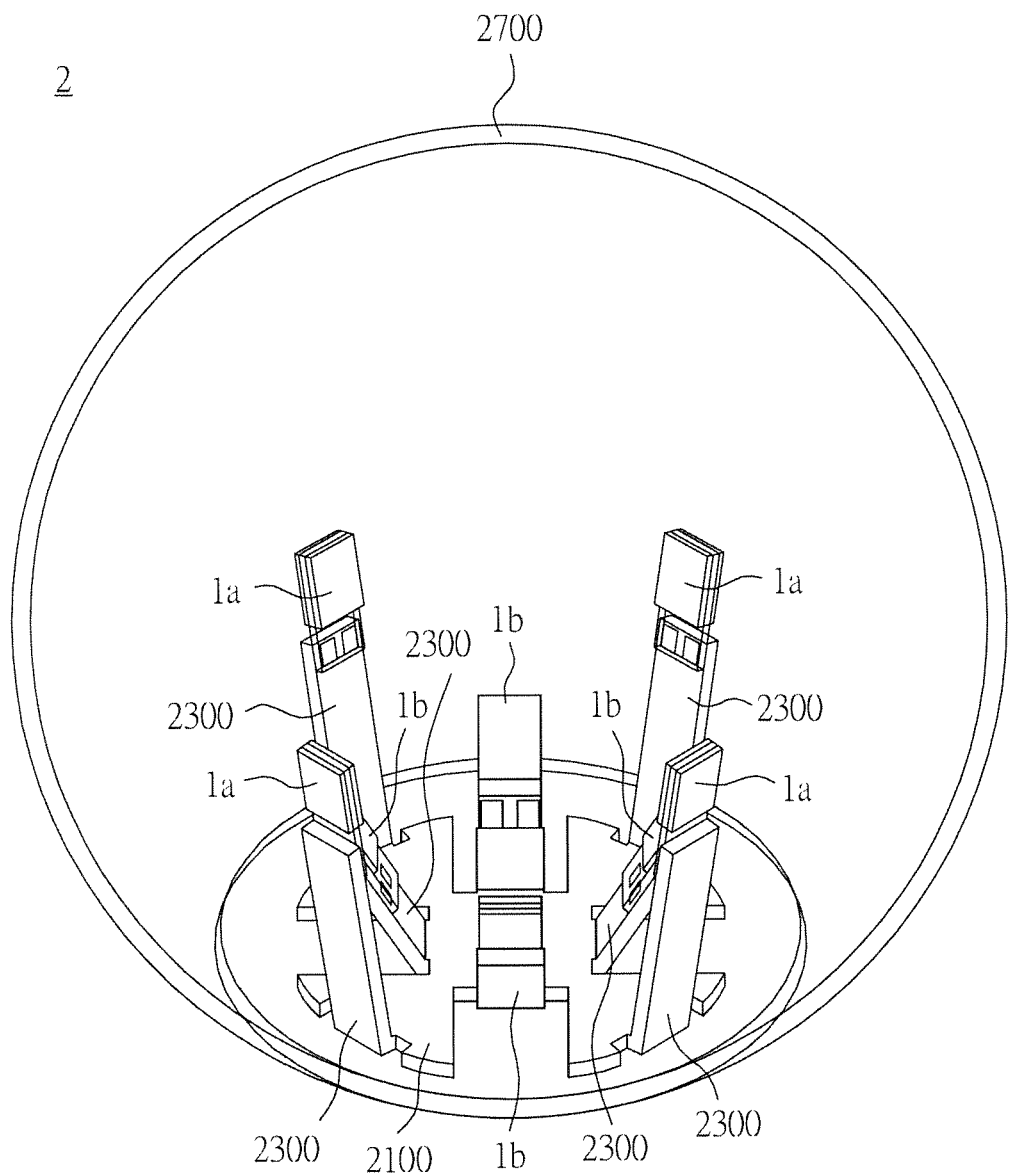

As shown in FIGS. 38-39, an illumination device 2 according to a twenty-fourth preferred embodiment of the present invention may comprise a supporting base 2100 having a first group of supports 2300 and a second group of supports 2300, and a first group of light emitting diodes 1*a* and a second group of light emitting diodes 1*b*, as described in the above embodiments, respectively disposed on the first group and the second group of supports 2300, wherein the first group of supports 2300 and the second group of supports 2300 may be alternatively arranged on the supporting base 2100. The quantity of the first group and the second group of supports 2300 may be the same or different from each other. The supporting base 2100 may have a symmetrical center 2101. In some embodiments for uniforming the light emitting from an illumination device 2 as shown in FIGS. 25, 38 and 39, a first angle θ1 between one of the first group of light emitting diodes 1*a* and the supporting base 2100 may be different from a first angle θ1 between one of the second group of light emitting diodes 1*b* and the supporting base 2100. In addition, a length of one of the first group of supports 2300 may be different from a length of one of the second group of supports 2300. For example, one of the first group of supports 2300 may be taller than one of the second group of supports 2300 as shown in FIG. 38 or FIG. 39, such that a height of one of the first group of light emitting diodes 1*a* may be different from a height of one of the second group of light emitting diodes 1*b*. Further, a distance between one of the first group of supports 2300 and the symmetrical center may be different from a distance between one of the second group of supports 2300 and the symmetrical center. For example, the distance between one of the first group of supports 2300 and the symmetrical center may be longer than the distance between one of the second group of supports 2300 and the symmetrical center as shown in FIG. 39.

Furthermore, for example according to the present invention as shown in FIG. 38, each group of the light emitting diodes 1*a*/1*b* may comprise at least four light emitting diodes 1, the diameter of the supporting base 2100 may range from 21 mm to 25 mm, the first angle θ1 between one of the first group of light emitting diodes 1*a* and the supporting base 2100 may range from 30 degrees to 150 degrees, the first angle θ1 between one of the second group of light emitting diodes 1*b* and the supporting base 2100 may range from 30 degrees to 150 degrees, the length of one of the first group of supports 2300 may range from 10 to 20 mm, and the length of one of the second group of supports 2300 may range from 12 to 17 mm. Wherein, the diameter of the supporting base 2100 is preferably equal or close to 21 mm; the first angle θ1 between one of the first group of light emitting diodes 1*a* and the supporting base 2100 is preferably the same with the first angle θ1 between one of the second group of the light emitting diodes I*b* and the supporting base 2100, and the first angle θ1 is equal or close to 80 degrees; the length of one of the first group of supports 2300 is preferably equal or close to 15 mm and the length of one of the second group of support 2300 is preferably equal or close to 12 mm.

Figure 40:
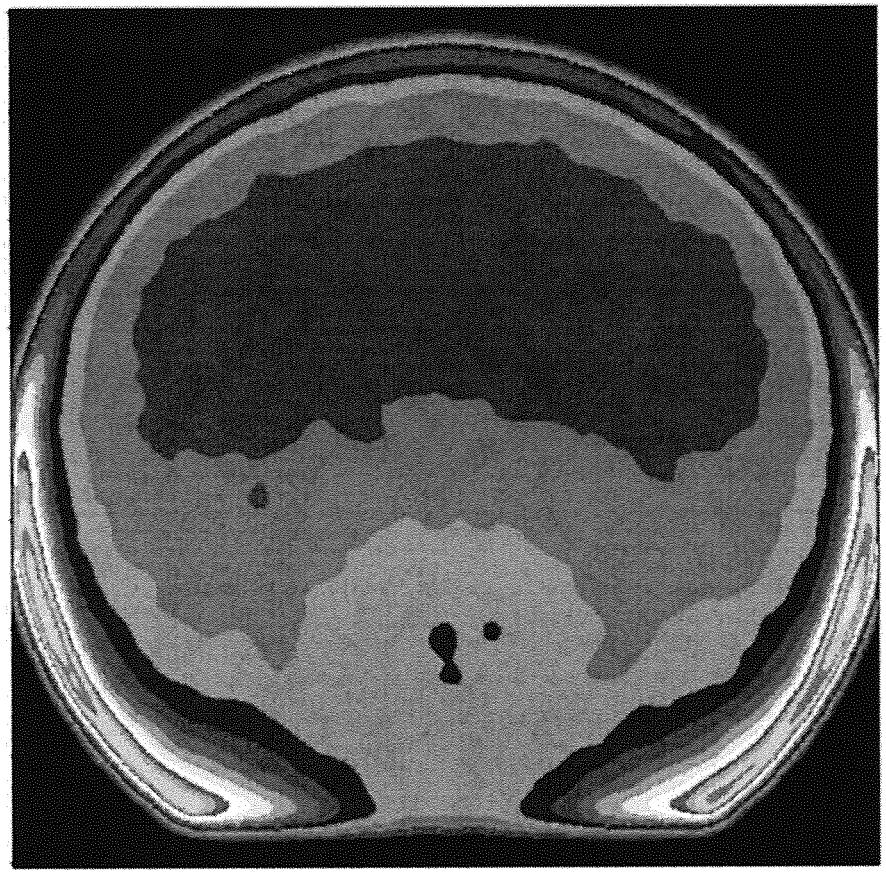
FIG. 40 is an illumination map of the illumination device according to the twenty-fourth preferred embodiment of the present invention

The illumination device 2 may further comprise a ball like housing 2700 as shown in FIG. 39. The supporting base 2100 of the illumination device 2 may further comprise a center portion and an extension portion extended from the center portion, wherein the different groups of supports 2300 may respectively extend from one side of the center portion and the extension portion. For example, when the quantity of the first group and the second group of light emitting diodes 1a/1b are the same and equal to four, and an outer-diameter of the housing 2700 is equal or close to 60 mm and an inter-diameter of the bottom of the housing 2700 is equal or close to 32 mm, the first angle θ1 between one of the first group of light emitting diodes 1a and the supporting base 2100 may range from 30 degrees to 150 degrees, the first angle θ1 between one of the second group of light emitting diodes 1b and the supporting base 2100 may range from 30 degrees to 150 degrees, the distance between one of the first group of supports 2300 and the symmetrical center 1201 of the supporting base 2100 may range from 10 mm to 13.5 mm, the distance between one of the second group of supports 2300 and the symmetrical center 1201 of the supporting base 2100 may range from 2 mm to 13.5 mm, the length of one of the first group of supports 2300 may range from 5 mm to 16 mm, and the length of one of the second group of supports 2300 may range from 5 mm to 20 mm. In addition, the first angle θ1 between one of the first group of light emitting diodes 1a and the supporting base 2100 is preferably equal or close to 80 degrees, the first angle θ1 between one of the second group of light emitting diode 1b and the supporting base 2100 is preferably equal or close to 60 degrees, the length of one of the first group of supports 2300 is preferably equal or close to 15.8 mm, the length of one of the second group of supports 2300 is preferably equal or close to 5.8 mm, the distance between one of the first group of supports 2300 and the symmetrical center 1201 of the supporting base 2100 is preferably equal or close to 12 mm, and the distance between one of the second group of supports 2300 and the symmetrical center 1201 of the supporting base 2100 is preferably equal or close to 5 mm. The illumination map of the illumination device 2 according to the twenty-fourth preferable embodiment is shown in FIG. 40, wherein the shadow of lighting effect is decreased and the light emitting from the illumination device 2 can be more uniform.

Further, a card shaped, stick shaped, popsicle shaped, cube shaped, ball shaped or candle shaped light emitting diodes 1 may be arranged on the supporting base 2100 to form like V-shape, U-shape, triangle-shape and polygon-shape from top view of the illumination device 2 according to the above embodiments of the present invention. The present invention can be applied in light bulbs, light tubes and advertisement boards, and the LED chip of the present invention is economical and has practical value because of the great light emitting effect, the low power consumption and the uniform emitted light.

It is known from above that the present invention provides an LED and a method for manufacturing the same. The characteristics of the present invention include that the metals pads are left exposed for the convenience of subsequent wiring and packaging processes. In addition, the LED provided by the present invention is a single light-mixing chip, which can be packaged directly without the need of coating fluorescent powders on the packaging glue. Because the fluorescent layer and the packaging glue are not processed simultaneously and are of different materials, the stress problem in the packaged LED can be reduced effectively.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:
1. A light emitting diode comprises:
a plurality of LED dies comprising an identical transparent substrate and a plurality of light emitting structures disposed on said transparent substrate;
at least two metal pads setting on said transparent substrate, wherein top surfaces of said metal pads set on the same plane essentially; and
a fluorescent layer setting on at least one of said LED dies and exposing said metal pads, wherein the thickness of said fluorescent layer is greater than 30 um;
wherein each of said light emitting structures comprises a first semiconductor, a light emitting layer set on said first semiconductor layer, and a second semiconductor layer set on said light emitting layer; and
wherein said transparent substrate comprises a support surface and a second main surface corresponding to said support surface.
2. The light emitting diode of claim 1, wherein said light emitting structures of said LED dies are arranged as a matrix in sequential or interlaced on said transparent substrate.
3. The light emitting diode of claim 1, wherein said light emitting structures of said LED dies are disposed respectively on said support surface and said second main surface.
4. The light emitting diode of claim 1, wherein said fluorescent layer is a first fluorescent layer disposed on said support surface of said transparent substrate, and the light emitting diode further comprises a second fluorescent layer disposed on said second main surface of said transparent substrate.
5. The light emitting diode of claim 1, wherein the thickness of said fluorescent layer is near or equal to 120 um.
6. The light emitting diode of claim 1, wherein said transparent substrate comprises at least one material selected from sapphire, aluminum oxide, silicon carbide, glass, plastic or rubber, and said transparent substrate has a thickness thicker than or equal to 200 um.
7. The light emitting diode of claim 1, wherein the light emitting diode is shaped like a card, a stick, a popsicle, a cube, a ball, or a candle.
8. A light emitting diode comprises:
an LED die comprising a transparent substrate and a light emitting structure disposed on said transparent substrate;
at least two metal pads setting on said transparent substrate, wherein top surfaces of said metal pads set on the same plane essentially; and
a fluorescent layer setting on said LED die and exposing said metal pads, wherein the thickness of said fluorescent layer is greater than 30 um;
wherein said light emitting structure comprises a first semiconductor, a light emitting layer set on said first semiconductor layer, and a second semiconductor layer set on said light emitting layer; and
wherein said transparent substrate comprises a support surface and a second main surface corresponding to said support surface, and said LED die may emit light in multi directions that at least part of the light emitted from said light emitting structure of said LED die may insert into and then emerge from said transparent substrate.
9. The light emitting diode of claim 8, wherein said fluorescent layer is a first fluorescent layer disposed on said support surface of said transparent substrate, and the light emitting diode further comprises a second fluorescent layer disposed on said second main surface of said transparent substrate.

10. A manufacturing method of a light emitting diode comprises:
   providing a light emitting structure of an LED die and at least two metal pads disposed on a transparent substrate of said LED die;
   providing first tape layers on said metal pads;
   providing a fluorescent layer on said LED die and between said first tape layers; and
   tearing said first tape layers to expose said metal pads;
   wherein top surfaces of said metal pads set on the same plane essentially, and the thickness of said fluorescent layer is greater than 30 um; and
   wherein said light emitting structure comprises a first semiconductor, a light emitting layer set on said first semiconductor layer, and a second semiconductor layer set on said light emitting layer.

11. The light emitting diode of claim 10, wherein said first tape layer comprises a sticky material selected from PE, PS, PET, PP, PTFE, PMMA, PC, PVC, fiber, metal, or compound material.

12. An illumination device, comprises:
   a supporting base having a symmetrical center; and
   a plurality of light emitting diodes disposed on said supporting base and around said symmetrical center;
   wherein at least one of said light emitting diodes comprises:
      an LED die comprising a transparent substrate and a light emitting structure disposed on said transparent substrate;
      at least two metal pads setting on said transparent substrate, wherein top surfaces of said metal pads set on the same plane essentially; and
      a fluorescent layer setting on said LED die and exposing said metal pads, wherein the thickness of said fluorescent layer is greater than 30 um;
      wherein said light emitting structure comprises a first semiconductor, a light emitting layer set on said first semiconductor layer, and a second semiconductor layer set on said light emitting layer.

13. The illumination device of claim 12, wherein a first angle between one of said light emitting diodes and said supporting base ranges from 30 to 150 degrees.

14. The illumination device of claim 12, wherein a first angle between one of said light emitting diodes and said supporting base ranges from 60 to 90 degrees.

15. The illumination device of claim 12, wherein a first angle between one of said light emitting diodes and the supporting base is equal or close to 60 degrees.

16. The illumination device of claim 12, wherein a first angle between one of said light emitting diodes and said supporting base is equal or close to 80 degrees.

17. The illumination device of claim 12, wherein at least two of said light emitting diodes are arranged not parallel to each other.

18. The illumination device of claim 12, wherein at least two of said light emitting diodes are arranged parallel to each other.

19. The illumination device of claim 12, wherein a major light emitting surface of one of said light emitting diodes does not face the symmetrical center.

20. The illumination device of claim 12, wherein said light emitting diodes comprise a first group and a second group of light emitting diodes, and wherein the distance between one of said first group of said light emitting diodes and said symmetrical center is different from the distance between one of said second group of said light emitting diodes and said symmetrical center.

21. The illumination device of claim 20, wherein the distance between one of said first group of said light emitting diodes and the symmetrical center ranges from 10 to 13.5 mm.

22. The illumination device of claim 20, wherein the distance between one of said second group of said light emitting diodes and said symmetrical center ranges from 2 to 13.5 mm.

23. The illumination device of claim 20, wherein said first group and said second group of said light emitting diodes are alternatively arranged on the supporting base.

24. The illumination device of claim 12, wherein said light emitting diodes comprise a first group and a second group of light emitting diodes; and wherein the height of one of said first group of said light emitting diodes is different from the height of one of said second group of said light emitting diodes.

25. The illumination device of claim 12, further comprises a plurality of supports disposed between at least a part of said light emitting diodes and said supporting base.

26. The illumination device of claim 25, wherein a length of one of said supports ranges from 5 to 20 mm.

27. The illumination device of claim 24, wherein said first group and said second group of said light emitting diodes are alternatively arranged on the supporting base.

28. The illumination device of claim 12, wherein said light emitting diodes comprise a first group and a second group of light emitting diodes, and wherein the angle between one of said first group of said light emitting diodes and said supporting base is different from the angle between one of said second group of said light emitting diodes and said supporting base.

29. The illumination device of claim 28, wherein said first group and said second group of said light emitting diodes are alternatively arranged on the supporting base.

30. The illumination device of claim 12, wherein said supporting base is shaped like a star or wheel.

31. The illumination device of claim 12, wherein said supporting base comprises at least two fins, wherein one of said light emitting diodes is disposed on one of said fins.

32. The illumination device of claim 12, wherein said supporting base comprises a center portion and an extension portion extended from said center portion, and at least two of said light emitting diodes are respectively disposed on said center portion and said extension portion.

33. The illumination device of claim 12, wherein said supporting base comprises a material selected from aluminum, copper, iron, silver, gold, nickel, ceramic or printed circuit board.

34. An illumination device, comprises:
   a support comprising an opening; and
   a light emitting diode disposed on said support and corresponding to the opening;
   wherein said light emitting diode comprises:
      an LED die comprising a transparent substrate and a light emitting structure disposed on said transparent substrate;
      at least two metal pads setting on said transparent substrate, wherein top surfaces of said metal pads set on the same plane essentially; and
      a fluorescent layer setting on said LED die and exposing said metal pads, wherein the thickness of said fluorescent layer is greater than 30 um;
      wherein said light emitting structure comprises a first semiconductor, a light emitting layer set on said first semiconductor layer, and a second semiconductor layer set on said light emitting layer.

* * * * *